United States Patent
Ito et al.

(10) Patent No.: US 6,711,188 B2
(45) Date of Patent: Mar. 23, 2004

(54) WAVELENGTH STABILIZING UNIT AND WAVELENGTH STABILIZED LASER MODULE

(75) Inventors: Akihiro Ito, Tokyo (JP); Junichi Shimizu, Tokyo (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/021,537

(22) Filed: Dec. 12, 2001

(65) Prior Publication Data

US 2002/0075912 A1 Jun. 20, 2002

(30) Foreign Application Priority Data

Dec. 18, 2000 (JP) ........................................ 2000-383293

(51) Int. Cl.[7] ................................................. H01S 3/13
(52) U.S. Cl. .............................................. 372/32; 372/30
(58) Field of Search ................................ 372/29.02, 32, 372/30, 45; 356/369, 237

(56) References Cited

U.S. PATENT DOCUMENTS

| | | | |
|---|---|---|---|
| 5,729,347 A | | 3/1998 | So ............................. 356/416 |
| 6,134,011 A | * | 10/2000 | Klein et al. ................. 356/369 |
| 6,198,757 B1 | * | 3/2001 | Broutin et al. ................ 372/32 |
| 6,215,801 B1 | * | 4/2001 | Ackerman et al. ............ 372/32 |
| 6,233,263 B1 | * | 5/2001 | Chang-Hasnain et al. .... 372/32 |
| 6,389,046 B1 | * | 5/2002 | Stayt et al. ............... 372/29.02 |

FOREIGN PATENT DOCUMENTS

| | | | |
|---|---|---|---|
| EP | 0 390 525 | 3/1990 | ........... H01S/3/094 |
| JP | 58-56539 | 4/1983 | ........... H04B/9/00 |
| JP | 9-121070 | 5/1997 | ........... H01S/3/133 |
| JP | 9-219554 | 8/1997 | ........... H01S/3/133 |
| JP | 10-79723 | 3/1998 | ........... H04J/14/00 |
| JP | 2914748 | 4/1999 | ........... H01S/3/133 |
| JP | 2989775 | 10/1999 | ........... H01S/3/13 |
| JP | 2000-56185 | 2/2000 | ........... G02B/6/42 |
| WO | WO 99/27664 | 6/1999 | ........... H04B/10/145 |

OTHER PUBLICATIONS

"Temperature–Tunable Silicon–Wafer Etalon for Frequency Chirp Measurements" Niemi, *Microwave and Optical Technology Letters*, vol. 20, No. 3, 1999, pp. 190–192.

* cited by examiner

*Primary Examiner*—Paul Ip
*Assistant Examiner*—Tuan Nguyen
(74) *Attorney, Agent, or Firm*—Hayes Soloway P.C.

(57) ABSTRACT

A wavelength stabilizing unit includes a wavelength filter 31 and an optical detector 4, which are mounted on a substrate 71, and housed in a casing 91. The optical detector 4 includes a first photoelectric conversion element 5, which directly receives an emitted light from an end portion (emitting point 58) of an optical fiber 14 guided into the casing 91 and converts it into an electric signal A, and a second photoelectric conversion element 6, which receives light passed through the wavelength filter 31 and converts it into an electric signal B. The electric signals A and B are supplied to an operation circuit 8. The wavelength filter 31 has side faces, which are machined such that they do not cross a straight line connecting the emitting point 58 and an edge of an incident surface 311 of the wavelength filter.

20 Claims, 16 Drawing Sheets

OPTICAL AXIS OF EMITTED LIGHT
$(180-\alpha) \geq \beta$

PLANE ORTHOGONAL TO OPTICAL AXIS OF EMITTED LIGHT

OPTICAL AXIS OF
EMITTED LIGHT
$(180-\alpha) \geqq \beta$

PLANE ORTHOGONAL TO OPTICAL AXIS
OF EMITTED LIGHT

OPTICAL AXIS OF EMITTED LIGHT $h_1 > h_2$ $(180-\alpha) \geqq \beta$

PLANE ORTHOGONAL
TO OPTICAL AXIS 55

$h_1 > h_2$

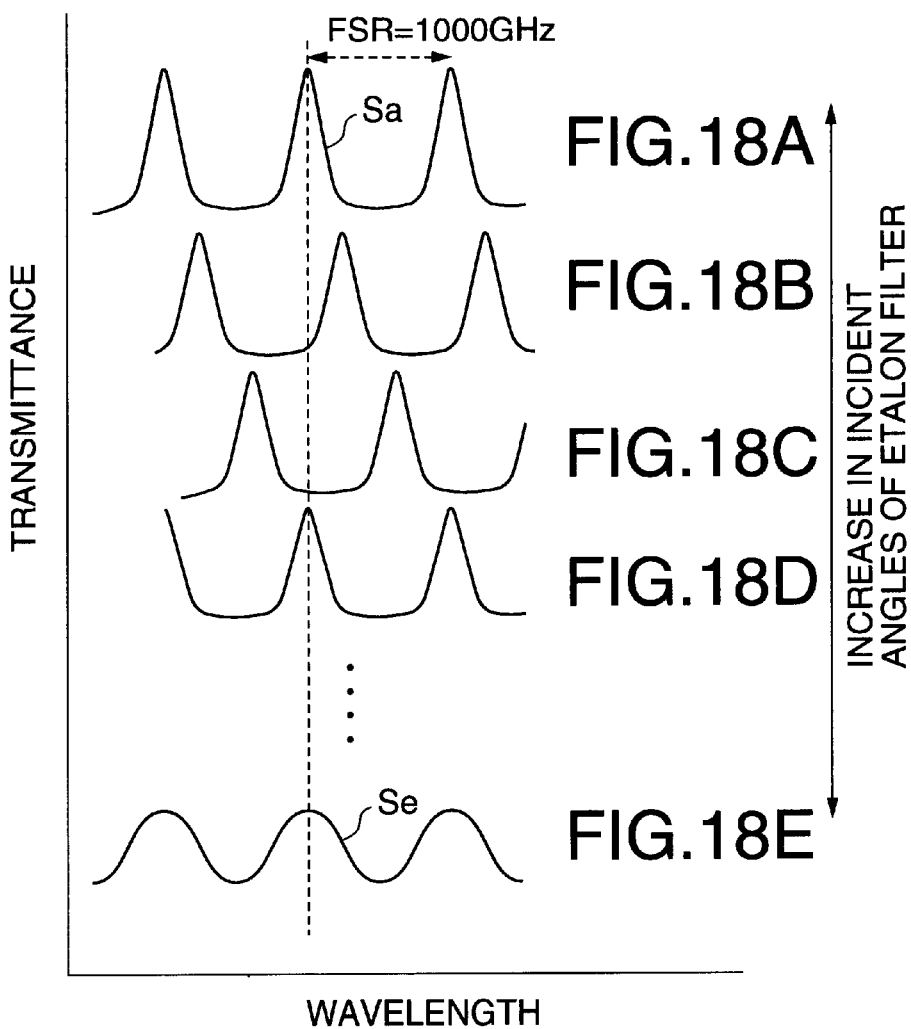
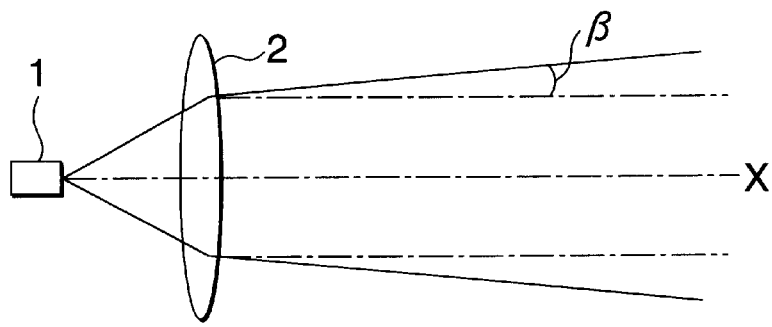
FIG.19

WAVELENGTH STABILIZING UNIT AND WAVELENGTH STABILIZED LASER MODULE

BACKGROUND OF THE INVENTION

1. Field of the Invention

The present invention relates to a wavelength stabilizing unit and a laser module using the same wavelength stabilizing unit and, in particular, the present invention relates to a wavelength stabilizing unit capable of stabilizing a wavelength of emitted laser light with high accuracy, simplifying a structure thereof and reducing a size thereof and a wavelength stabilized laser module using the same wavelength stabilizing unit.

2. Description of the Prior Art

A semiconductor laser has been used as a light source of an optical fiber communication system. In particular, a single axial mode semiconductor laser such as DFB (distributed feedback) laser has been employed for optical fiber communication over distances of tens of kilometers or more in order to restrict wavelength dispersion. However, though the DFB laser oscillates at a single wavelength, its oscillation wavelength is changed depending on the temperature of the semiconductor laser device and/or an injected current. Moreover, in the optical fiber communication system, in which it is important to keep strength of light output of a semiconductor laser light source at a constant level, control is conventionally exercised so as to keep the temperature of the semiconductor laser device and the output light strength of the semiconductor laser light source in constant levels, respectively. Basically, by keeping the temperature of the semiconductor laser device and the injected current at constant levels, light output and oscillation wavelength of the semiconductor laser device is maintained constant. However, if the quality of semiconductor laser device is degraded due to longtime use, the injected current required for keeping the light output at constant level increases, causing the oscillation wavelength to change. However, since an amount of the change of the oscillation wavelength is slight, substantially no problem occurs in the conventional optical fiber communication system.

In recent years, a dense wavelength division multiplexing (DWDM) method in which multiple pieces of light each having a different wavelength are multiplexed in one optical fiber becomes mainstream in the conventional optical fiber communication system and the interval among a plurality of oscillation wavelengths used for the DWDM system becomes as narrow as 100 GHz or 50 GHz. In this case, the degree of wavelength stabilization required for the semiconductor laser device, which is used as the light source, is, for example, wavelength change within ±1 nm for a $2\times10^5$ hours (about 25 years) use. Therefore, the conventional wavelength stabilization by using the conventional constant element temperature-constant light output control becomes not sufficient to obtain the required degree of wavelength stabilization. Moreover, even if the temperature of the semiconductor laser itself is successfully controlled so as to remain constant, the oscillation wavelength is changed slightly when the ambient temperature around the semiconductor laser device changes and an amount of such slight change in the oscillation wavelength may become a problem in the recent conventional optical fiber communication system.

In order to restrict such change in the oscillation wavelength of the semiconductor laser light to thereby stabilize the oscillation wavelength, some wavelength stabilized devices have been proposed in such as JP H10-209546 A (Japanese Patent No. 2989775), JP H4-157780 A (Japanese Patent No. 2914748), JP H9-219554 A, JP H10-79723 and JP H9-121070. However, each of the proposed wavelength stabilized devices requires a large number of parts and a large space, so that it becomes difficult to house the wavelength stabilized device in the generally used casing of the conventional semiconductor laser module. Moreover, the setting of a reference wavelength to be stabilized is difficult and the fabrication cost becomes high.

On the other hand, Japanese Patent Application No. 2000-67606, which corresponds to U.S. patent application Ser. No. 09/804,499 assigned to the assignee of the present application and will be referred to as "prior application", hereinafter, proposes a wavelength stabilized laser module capable of solving the above problems. FIG. 10A shows an example of a construction of a wavelength stabilized laser module proposed in the prior application and FIG. 10B shows a portion thereof in an enlarged scale. The wavelength stabilized laser module shown in FIG. 10A and FIG. 10B includes a semiconductor laser 801 housed in a casing 809, a lens 802 for converting rearward diverging light emitted from the semiconductor laser into parallel light bundle, a first photoelectric conversion element 805, which directly receives a portion of the parallel light bundle passed through the lens 802 and converts the light portion into an electric signal, an etalon-type filter 831, which receives another portion of the parallel light bundle passed through the lens 802, and a second photoelectric conversion element 806, which converts light passed through the etalon-type filter 831 into an electric signal.

The semiconductor laser 801 is mounted on a substrate 807 equipped with a Peltier element so that temperature thereof during operation can be regulated. An incident angle of light to the etalon type filter 831 can be regulated by an angle regulating mechanism, which is not shown. The first photoelectric conversion element 805 and the second photoelectric conversion element 806 are arranged in parallel on a supporting substrate 849 to form an array type optical detector 804. The optical detector 804 is slanted with respect to an optical axis of the incident light in order to prevent light from being reflected back to the semiconductor laser.

The wavelength stabilized laser module constructed as mentioned above has is highly accurate, has small number of parts, has good space efficiency and has a size small enough to be housed in a casing of the semiconductor laser module, which has been used usually. Further, since the assembling of the wavelength stabilized laser module and the positional regulation thereof are easy, the fabrication cost thereof can be substantially reduced.

As mentioned above, it has been found that the considerable effects can be obtained by the wavelength stabilized laser module proposed in the prior art application. However, the inventors of the present invention conducted various experiments on the proposed wavelength stabilized laser module and have found that the latter wavelength stabilized laser module has some points to be improved.

The points to be improved will be described in detail with reference to FIG. 12, which shows graphs illustrating relations between an oscillation wavelength λ of a semiconductor laser in abscissa and currents Im of a strength monitoring PD (photo diode) when laser light emitted from the semiconductor laser is incident directly on the photoelectric conversion element and a wavelength monitoring PD when the output light is incident on the photoelectric conversion element after passed through a predetermined filter such as an etalon-type filter, in ordinate. Further, as described in the prior art application, the oscillation wavelength of the semiconductor laser is changed depending on not only change of temperature of the photoelectric conversion element but also change of injected current of the semiconductor laser, as shown in FIG. 13A and FIG. 13B. On the contrary, the light output is changed by not only change of the injected current but also change of temperature as shown in the same figures. Considering a case where the oscillation wavelength of the semiconductor laser is controlled to a reference wavelength λo while keeping the optical output thereof constant, on the basis of the graph shown in FIG. 12, it is possible to simultaneously control the oscillation wavelength and the output light of the semiconductor laser by controlling the current $I_{pd1}$ detected by the strength monitoring PD and the current $I_{pd2}$ detected by the wavelength monitoring PD such that $(I_{pd1}+I_{pd2})$ and $(I_{pd1}-I_{pd2})$ become constant, respectively. This control can be realized by controlling at least either one of the injected current and the temperature of the semiconductor laser as will be clear from FIG. 12.

However, according to various experiments conducted by the present inventors, it has been found that the stability of the oscillation wavelength of the wavelength stabilized laser module shown in FIG. 10 can be further improved. That is, in the wavelength stabilized laser module shown in FIG. 10, the current of the first photoelectric conversion element 805, that is, the strength monitoring PD, exhibited unstable change depending on wavelength as shown by portions Q1 to Q4. From this, it has been found that, if the wavelength dependency of the current of the first photoelectric conversion element (PD) can be made closer to the wavelength dependency of the current of the strength monitoring PD shown by the solid line in FIG. 12, the oscillation wavelength control can be performed highly accurately. On the basis of this knowledge, the cause of occurrence of the unstable portions Q1 to Q4 was investigated and it has been found that the unstable wavelength dependency of the current of the strength monitoring PD such as shown by Q1 to Q4 in FIG. 12 occurs due to stray light incident on the first photoelectric conversion element 805, which contains reflection light 850, which is a portion of the parallel light bundle incident on a side face 833 of the filter 831 and reflected by the side face 833 to the photoelectric conversion element 805, and multiplexed reflection light 852, which is a light incident on the side face 833 and reflected to the photoelectric conversion element 805 after reflected a plurality of times within the filter 831.

SUMMARY OF THE INVENTION

The present invention was made to solve the above mentioned problems and has an object to provide a low cost wavelength stabilizing unit capable of further stabilizing an oscillation wavelength of a semiconductor laser with higher accuracy by stabilizing current of a photoelectric conversion element for monitoring strength of laser light by restricting stray light incident thereon, of reducing size thereof to a size small enough to be encased in a casing of a conventional semiconductor laser module, of reducing the number of parts and of very easily and highly accurately setting a reference wavelength at which the oscillation wavelength is to be stabilized, and a wavelength stabilized laser module using the same wavelength stabilizing unit.

In order to achieve the above object, a wavelength stabilizing unit according to the present invention comprises at least a first photoelectric conversion means converting a portion of a laser light emitted from a predetermined emitting point of a semiconductor laser equipped with a temperature regulation means into an electric signal, a wavelength filter having transmittance continuously changed depending on wavelength of a portion of the emitted light incident directly thereon, a second photoelectric conversion means for converting light passed through the wavelength filter into an electric signal and stray light blocking means for preventing the emitted light incident on a side face portion of the wavelength filter from being incident on the first photoelectric conversion means through the wavelength filter, wherein the electric signals from the first and second photoelectric conversion means are operated to obtain a control signal for stabilizing wavelength of the emitted light and the control signal is fedback to at least one of the semiconductor laser and the temperature regulating means thereof to stably output a laser light having a reference wavelength at which the oscillation wavelength of the semiconductor laser is stabilized.

This wavelength stabilizing unit may further comprise light bundle paralleling means for converting the divergent light emitted from the semiconductor laser into a parallel light bundle, wherein the first photoelectric conversion means receives a portion of the parallel light bundle directly. The wavelength filter may receive another portion of the parallel light bundle directly and the light bundle paralleling means may be an optical lens.

It is preferable that the parallelism of the parallel light bundle, that is, angle of deviation with respect to the optical axis, is within ±2°.

With this scheme, adverse effect on the transmittance due to that the incident angle differs depending on location of the wavelength filter is minimized, so that the wavelength stabilization can be achieved with very high accuracy.

The stray light blocking means may be a stray light blocking wavelength filter fabricated such that a straight line connecting the emitting point and an edge portion of an incident surface of the wavelength filter on which the emitted light is incident and an extension of the straight line do not cross the side face of the wavelength filter.

In the stray light blocking means in a case where the wavelength stabilizing unit includes the light bundle paralleling means, the wavelength filter may be mounted such that a distance between a first edge portion of the incident surface thereof closest to the optical axis of the parallel light bundle and the light bundle paralleling means is larger than a distance between a second edge portion of the incident surface remotest from the optical axis of the parallel light bundle and the light bundle paralleling means and the wavelength filter does not cross the optical axis of the parallel light bundle. Alternatively, a stray light blocking wavelength filter fabricated by machining the side faces of the wavelength filter such that it is not irradiated with the parallel light bundle may be used. In such case, the stray light blocking wavelength filter may be provided by machining the wavelength filter such that at least the side faces thereof, which are irradiated with the parallel light bundle, do not cross a line parallel to the optical axis of the parallel light bundle passing the edge portion of the incident surface of the wavelength filter on which the parallel light bundle is incident. Alternatively, an angle of the side face of the stray light blocking wavelength filter with respect to the incident surface thereof on which the parallel light bundle is incident may be set smaller than an angle of the incident surface thereof with respect to a portion of the optical axis of the parallel light bundle, which is on the side of the first photoelectric conversion means from the stray light blocking wavelength filter.

Alternatively, the stray light blocking means may be a stray light blocking wavelength filter having the side faces thereof coated with a predetermined material selected from a group containing at least non-reflection film materials and light absorbing film materials or may be a stray light blocking wavelength filter having side faces coated with a reflection film such that the first photoelectric conversion element is not irradiated with light reflected by the side faces. Alternatively, it may be possible to form the stray light blocking wavelength filter by making the side faces irregular by roughing it.

Preferably, the wavelength filter has transmission characteristics in which the transmittance monotonically increases or decreases depending on wavelength in a wavelength band containing the reference wavelength at which the oscillation wavelength of the semiconductor laser is to be stabilized.

By selecting a wavelength filter whose change of transmittance with change of wavelength within the wavelength band including the reference wavelength, that is, gradient of transmission spectrum, is monotonically increases or decreases, the second photoelectric conversion means can immediately detect wavelength of the laser light, which varies on a short wavelength side or a long wavelength side with respect to the reference wavelength, as a change of strength of the light transmitted through the filter on a dark side or a bright side.

It is preferable that the wavelength filter can change the gradient of the wavelength dependent change of transmittance by regulating the incident angle of the incident light.

If the gradient of wavelength-dependent transmittance can be changed by regulating the incident angle of light, it becomes possible to improve the sensitivity of detection related to wavelength variation to thereby stabilize the wavelength with high accuracy by making the gradient sharp and, on the other hand, to expand the band width of wavelength capable of detecting the variation by making the gradient gentle.

It is preferable that the wavelength filter has a single peak transmission characteristics in which the transmittance in a wavelength band, which does not include the reference wavelength, becomes maximum or minimum. If the reference wavelength is in the maximum transmission band or the minimum transmission band of the transmission characteristics of the wavelength filter, the sensitivity for wavelength variation is substantially lowered. When the transmission characteristics of the wavelength filter is of single peak type, it becomes possible to perform a highly accurate wavelength detection in a wide wavelength band within the wavelength band in which the semiconductor laser can oscillate, except very narrow maximum or minimum transmission band if any.

The wavelength filter may use a multi-layered filter fabricated by forming a multi-layered film-by-film layers having different dielectric materials on a transparent substrate.

Since thickness of the transparent substrate such as a glass substrate of the multi-layered filter can be set arbitrarily, the filter can be made compact by reducing the thickness of the glass substrate.

Alternatively, an etalon type filter having a transmittance period in which the transmittance is periodically changed between extreme value and minimal value with constant wavelength interval may be used as the wavelength filter.

Since the etalon type filter has a plurality of extreme points and minimal points within the wavelength band, which the semiconductor laser can oscillate, it is possible to set the reference wavelengths in spectrum gradients each defined by a line connecting paired extreme point and minimal point, so that a stabilization of a plurality of reference wavelengths becomes possible in a multiplexed light transmission system, which utilizes a wavelength variable semiconductor laser as a light source, by using a single wavelength stabilizing unit.

It is preferable that the semiconductor laser is of the wavelength variable type capable of oscillating at a plurality of wavelengths depending on temperature and the wavelength interval of the transmittance period of the etalon type filter is set according to the following equation:

$$D = (1 - T_{etalon}/T_{LD}) \times D_0 \qquad (1)$$

where D represents the wavelength interval of transmittance period of the etalon type filter, $D_0$ represents an interval between a plurality of oscillation wavelengths of the semiconductor laser, $T_{etalon}$ represents an amount of change of a center frequency when temperature of the etalon type filter is changed by 1° C. and $T_{LD}$ represents an amount of change of oscillation frequency of the semiconductor laser when temperature thereof is changed by 1° C. Incidentally, the center wavelength represents a certain one of the wavelengths, at which the transmittance becomes maximum.

By using a semiconductor laser having temperature dependent wavelength and setting the wavelength interval of the transmittance period of the etalon type filter according to the Equation 1, it becomes possible to set a plurality of reference wavelengths used in the multiplexed light transmission system in the spectrum gradients connecting the extreme points and the minimal points of the transmittance period. As a result, the plurality of the wavelengths at which the semiconductor laser oscillates can be stabilized by using a single wavelength stabilizing device.

The etalon-type filter is preferably formed of a transparent material having refractive index larger than that of quartz glass. It is preferable that the transparent material having refractive index larger than that of quartz glass is Si (silicon)-based material.

By using a transparent material, which has refractive index larger than that of quartz glass and is used as a basic material of, for example, an etalon type filter or a multi-layered filter, it is possible to further reduce the thickness of the wavelength filter to thereby further reduce a space required for the device. Since silicon is transparent, has refractive index larger than that of quartz and is a relatively inexpensive material widely used in the semiconductor field, it is the most preferable material of the wavelength filter used in the present invention.

It is preferable that the first photoelectric conversion means and the second photoelectric conversion means are arranged in parallel on a supporting substrate to form an array type optical detector.

Since, in the wavelength stabilizing unit of the present invention, there is no need of complicated angle regulations of the first photoelectric conversion means and the second photoelectric conversion means, the number of parts and the number of assembling steps are reduced by using the optical detector formed by arranging them in parallel on one and the same supporting substrate, so that the fabrication cost can be reduced.

It is preferable that a light receiving surface of the first photoelectric conversion means is slanted with respect to the optical axis of the incident light.

With such arrangement of the first photoelectric conversion means with respect to the optical axis of the incident light, reflection of light from the light receiving surface of the first photoelectric conversion means back to the semiconductor laser is excluded, so that the change of oscillation characteristics of the semiconductor laser due to returning of light can be restricted.

The wavelength stabilized laser module according to the present invention may include a semiconductor laser, temperature regulating means for regulating temperature of the semiconductor laser and a wavelength stabilizing unit for stabilizing oscillation wavelength of the semiconductor laser. Any of the wavelength stabilizing units previously described can be used as the wavelength stabilizing unit of the wavelength stabilized laser module.

In this case, the semiconductor laser may be constructed by integrating it with an exciton absorption type semiconductor optical modulator.

When the semiconductor laser is integrated with the exciton absorption type semiconductor optical modulator, it is possible to construct the whole optical transmission system compact compared with a usual case where a DFB laser and an external modulator are constructed as a separate module.

The temperature regulating means is preferably a Peltier element. Since the Peltier element can precisely set a temperature in an arbitrary temperature range by electronic control and has a thin wall structure, it can be housed in the casing of the wavelength stabilized laser module by sticking it to a substrate of the wavelength stabilized laser module.

It is preferable that the wavelength stabilized laser module according to the present invention includes an optical fiber as laser light output means and at least the semiconductor laser, the temperature regulating means and any of the wavelength stabilizing unit are encased in a single casing.

The above mentioned wavelength stabilizing unit and the wavelength stabilized laser module using the wavelength stabilizing unit, according to the present invention, are constructed with a minimum number of parts and can be regulated easily. Therefore, it is possible to easily incorporate the present wavelength stabilized laser module even in a small casing for a conventional semiconductor laser module having no wavelength stabilizing unit.

BRIEF DESCRIPTION OF THE DRAWINGS

FIGS. 18A to 18E are a transmission spectrum of an etalon-type filter, showing variation of peak wavelengths;

FIG. 19 illustrates parallelism of light passed through an optical lens;

DETAILED DESCRIPTION OF THE PREFERRED EMBODIMENTS

Figure 1A:
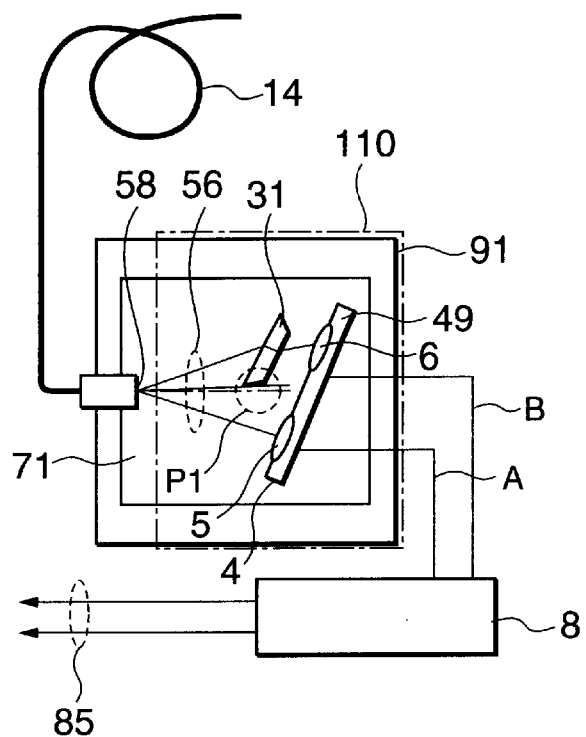
FIG. 1A shows a main construction of a wavelength stabilizing unit according to a first embodiment of the present invention.

The present invention will be described in detail with reference to the drawings. In the following description, same constructive components are depicted by same reference numerals, respectively, and described in detail at first occurrences thereof. However, detailed description thereof at subsequent occurrences will be omitted in order to avoid duplication.

FIG. 1A to FIG. 2B show constructions of wavelength stabilizing units in which laser diodes (LD's), which are not shown, are incorporated in other modules and lights emitted by LD's are guided to the wavelength stabilizing units through optical fibers 14, respectively.

Figure 1B:
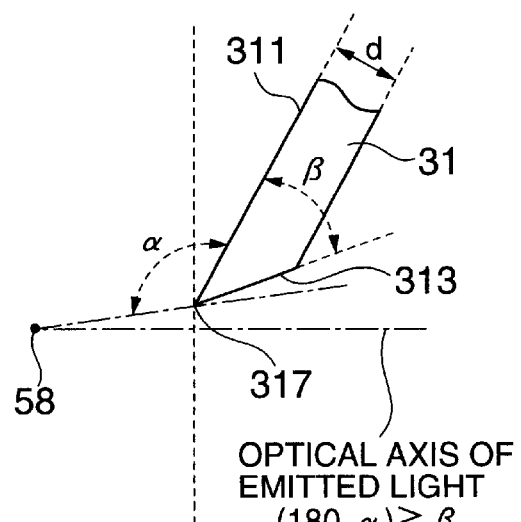
FIG. 1B shows a portion P1 in FIG. 1A in an enlarged scale.
Figure 11:
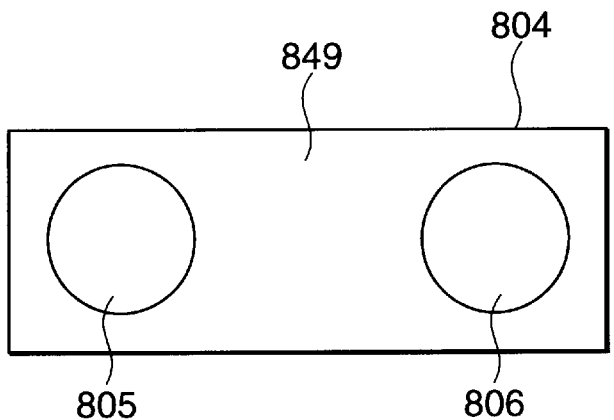
FIG. 11 is a plan view of an optical detector shown in FIG. 10A.
Figure 12:
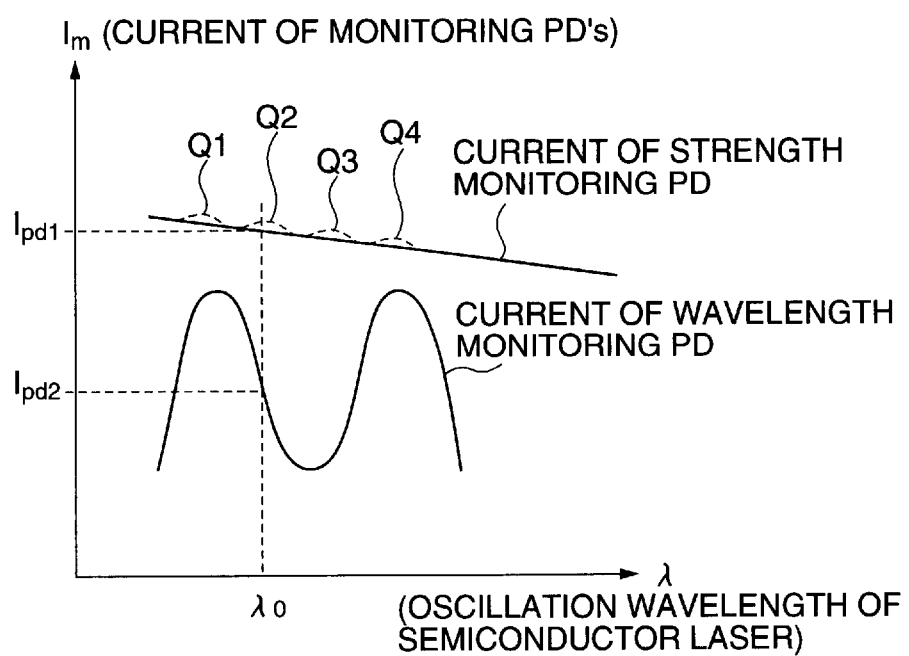
FIG. 12 is a graph showing a relation between currents of strength monitoring PD and a wavelength monitoring PD of laser light and wavelength of the laser light of a semiconductor laser.

Referring to FIG. 1A, a wavelength stabilizing unit 110 according to a first embodiment of the present invention includes a wavelength filter 31 having light transmittivity, which is continuously changed depending on wavelength of laser light, and an optical detector 4. The wavelength filter 31 and the optical detector 4 are mounted on a substrate 71 and housed in a casing 91. The optical detector 4 has a construction similar to the optical detector 804 shown in FIG. 11 and includes a first photoelectric conversion element 5 and a second photoelectric conversion element 6, which are arranged in parallel on a supporting substrate 49 to form an array type optical detector. The first photoelectric conversion element 5 directly receives a portion of light 56 emitted divergently from an emitting point 58 of a semiconductor laser, which is set in an end portion of the optical fiber 14 guided into the casing 91, and converts it into an electric signal A. The second photoelectric conversion element 5 receives another portion of the light 56 after passed through the wavelength filter 31 and converts it into an electric signal B. An operation circuit 8 operates the electric signals A and B. An incident angle of light incident on the wavelength filter 31 can be regulated by an angle regulating mechanism, which is not shown, and side face portion P1 of the wavelength filter 31 are machined such that the side faces do not cross a straight line connecting the light emitting point 58 and an edge portion 317 of an incident surface 311 of the wavelength filter 31 as shown in FIG. 1B. In detail, assuming that the angle between the straight line connecting the light emitting point 58 and the edge portion of the incident surface 311 is $\alpha$ degrees and an angle between the side face 313 and the incident surface 311 is $\beta$ degrees as shown in FIG. 1B, the side face 313 is machined by such as polishing such that an equation $(180-\alpha) \geq \beta$ is established. Such machining is also performed for at least a portion of the other side faces, which are irradiated with the emitted light 56.

The wavelength filter 31 and the optical detector 4 are arranged in slanted relation to a plane orthogonal to the optical axis of the emitted light 56 in order to eliminate light reflected back to the light emitting point 58. When the side faces 313 of the wavelength filter 31 does not cross the optical axis of the emitted light 56, the wavelength filter 31 and the optical detector 4 may be arranged in parallel to the plane orthogonal to the optical axis of the emitted light 56.

In the wavelength stabilizing unit 110 according to this embodiment, light emitted from a LD (not shown) is directed to the casing 91 through the optical fiber 14 and divergently emitted in the casing 91 from the light emitting point 58 as the emitted light 56. A portion of the emitted light 56 is directly incident on the first photoelectric conversion element 6 and converted thereby into the electric signal A. Another portion of the emitted light 56 is incident on the wavelength filter 31. The wavelength filter 31 outputs light having strength depending on wavelength of incident light and the output light is incident on the second photoelectric conversion element 6 and converted thereby into the electric signal B. Therefore, the electric signal A carries an optical output information of the LD at that time point and the electric signal B carries an information containing the optical output information of the LD at that time point and the wavelength information of the light from the LD at that time point. By appropriately regulating the angle of the incident surface 311 of the wavelength filter 31 with respect to the optical axis, the electric signal B can carry an information of wavelength variation within a range having a center wavelength equal to the reference wavelength $\lambda_0$, which is an aimed value at which the wavelength is to be stabilized.

In the wavelength stabilizing unit 110, the electric signals A and B are supplied to the operation circuit 8. The operation circuit 8 detects a variation of the light output of the LD and a variation of the oscillation wavelength from a sum of the electric signals A and B and a difference between the electric signal A and the electric signal B and continuously feedbacks a control signal 85 to at least one of an injected current regulating device and a temperature regulating device for the LD, which are not shown, such that the light output and the oscillation wavelength become predetermined values, which are determined by a desired light output and the reference wavelength $\lambda_0$, to stabilize the light output of the LD and the oscillation wavelength.

The wavelength stabilizing unit 110 according to this embodiment of the present invention does not require such part as a beam splitter, which is conventionally used in order to obtain a wavelength dependent signal and a wavelength independent signal, so that the number of parts is small and space efficiency is high. Therefore, the size of the wavelength stabilizing unit can be made small enough to be encased in a casing of the conventional semiconductor laser module. Further, since the assembling thereof and the regulating operation during the fabrication of the wavelength stabilizing unit are simple and easy, there is a merit that the fabrication cost of the wavelength stabilizing unit can be substantially reduced. Further, since, as mentioned previously, at least the portion of the side face of the wavelength filter 31, which is irradiated with the emitted light 56, is machined such that the side face does not cross the straight line connecting the light emitting point 58 and the edge portion of the incident surface 311 of the wavelength filter 31, there is no stray light containing light reflected by the side face and light incident on the side face of the wavelength filter and reflected a plurality of times within the wavelength filter, so that the light output and the oscillation wavelength can be stabilized with higher accuracy.

Figure 2A:
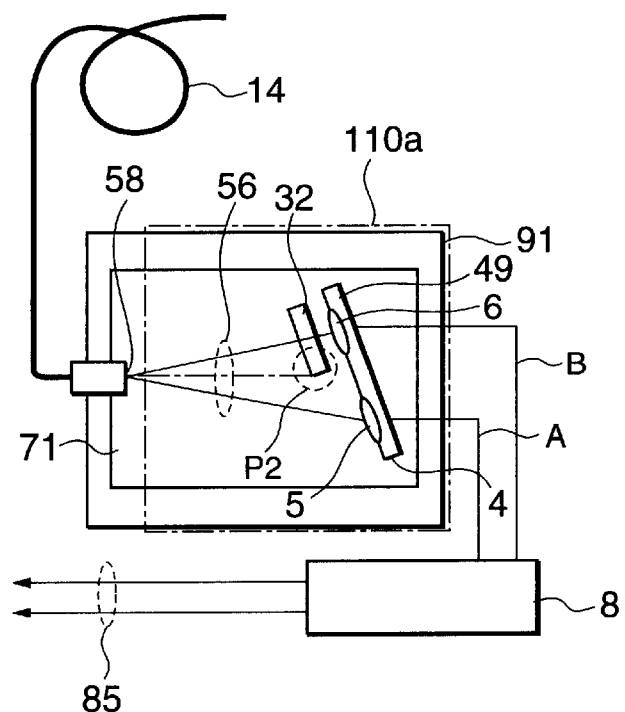
FIG. 2A shows a modification of the main construction of the wavelength stabilizing unit shown in FIG. 1A.
Figure 2B:
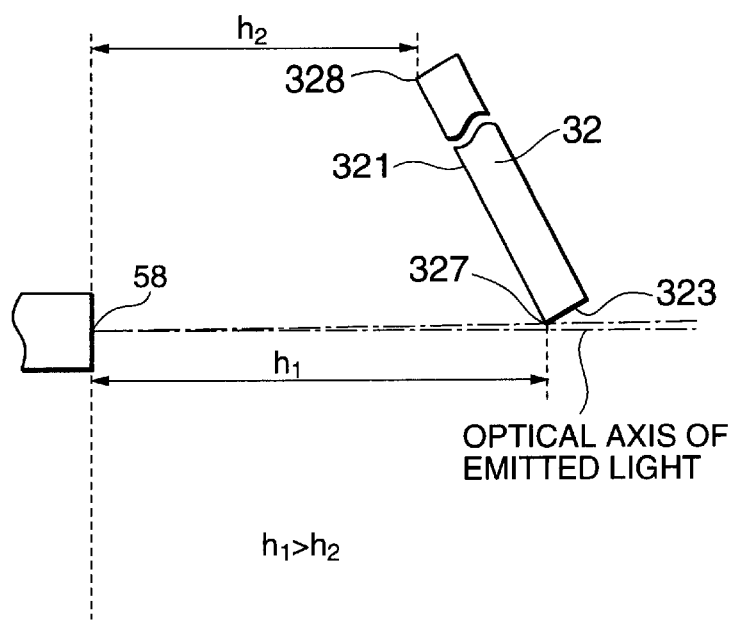
FIG. 2B shows a portion P2 in FIG. 2A in an enlarged scale.

Now, a modification of this embodiment will be described with reference to FIG. 2A and FIG. 2B. In a wavelength stabilizing unit 110a shown in FIG. 2A, which is the modification of the first embodiment of the present invention, includes a wavelength filter 32. The wavelength filter 32 is arranged such that a distance $h_1$ between a first edge portion 327 close to an optical axis of the emitted light 56 and the light emitting point 58 along the optical axis is larger than a distance $h_2$ between a second edge portion 328 remote from the optical axis and the light emitting point 58 along the optical axis as shown FIG. 2B. Therefore, even when side faces including a side face 323 of the wavelength filter 32 are machined at right angle with respect to an incident surface 321 of the wavelength filter 32, at least the side face 323 does not cross a straight line connecting the light emitting point 58 and the ridge portion of the incident surface 321 of the wavelength filter 32, resulting in a similar effect to that obtainable in the wavelength stabilizing unit 110.

Figure 3:
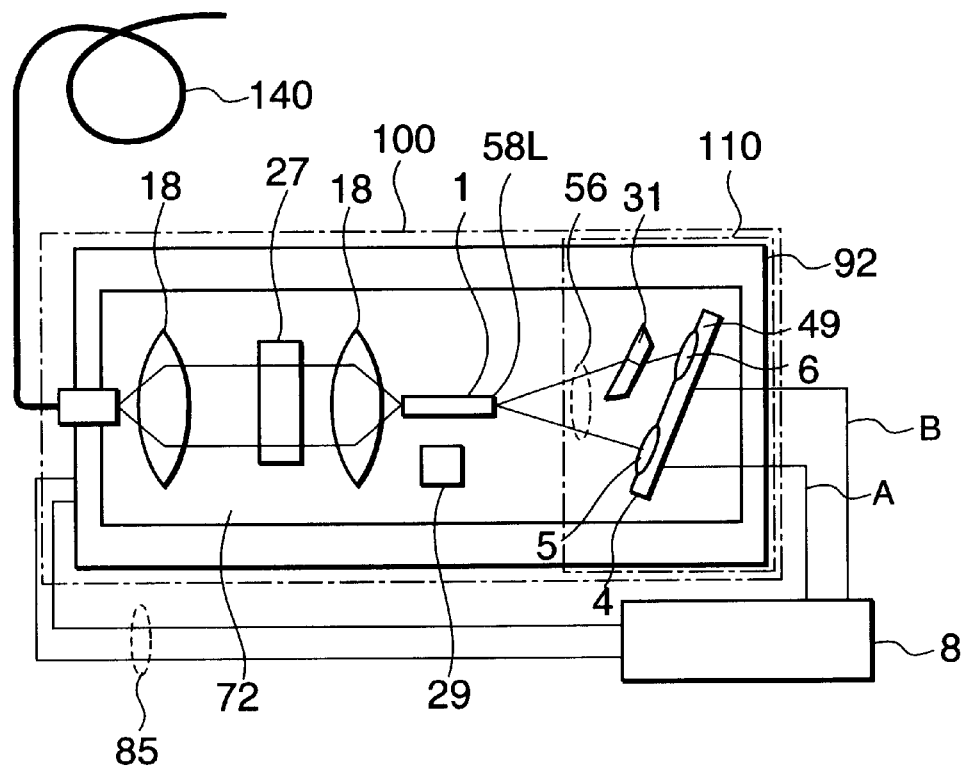
FIG. 3 shows an example of a wavelength stabilized laser module constructed by incorporating the wavelength stabilizing unit according to the first embodiment of the present invention and a LD in a single casing.

FIG. 3 shows a wavelength stabilized laser module 100, which is encased in a casing 92 together with the wavelength stabilizing unit 110 and a LD 1. It is of course possible, in this case, to substitute the wavelength stabilizing unit 110a for the wavelength stabilizing unit 100. Referring to FIG. 3, the first photoelectric conversion element 5 directly receives a portion of the light 56 divergently emitted from a light emitting point 58L, which is an output end of the LD 1, and converts it into an electric signal A and the second photoelectric conversion element 6 receives another portion of the emitted light 56 passed through the wavelength filter 31 and converts it into an electric signal B. The LD 1 is mounted on a substrate 72 equipped with, for example, a Peltier element so that an operating temperature thereof can be regulated. The wavelength filter 31 and the optical detector 4 are arranged in a slanted relation to a plane orthogonal to the optical axis of the emitted light 56 such that light reflected by the wavelength filter 31 and the optical detector 4 is not directed back to the light emitting point 58L, in this case, the LD 1.

Further, an optical fiber coupling lens 18, an optical isolator 27 and a thermistor 29 for temperature detection, etc., are mounted on the same substrate 72. The substrate 72 having these components thereon is incorporated in the casing 92, which may have a similar size to that of the casing of the conventional semiconductor laser module, together with the LD 1 and the wavelength stabilizing unit 110 and a signal light for optical communication is supplied from an optical fiber 140 connected to the casing. As mentioned, the temperature of the substrate 72 is controllable by the Peltier element mounted thereon, so that temperature of the LD 1 is controlled to stabilize oscillation wavelength of the LD 1 and to control all of the optical elements in the casing 92 to a constant temperature. Since the oscillation wavelength stabilizing operation of the wavelength stabilized laser module 100 is the same as that of the wavelength stabilizing unit 110, details thereof are omitted except that the control signal 85 is fedback to an injected current regulating device and the Peltier element as a temperature regulation device of the LD 1, which are not shown.

The wavelength stabilized laser module constructed by incorporating the LD 1 and the wavelength stabilizing unit 110 can stabilize the optical output and the oscillation wavelength thereof with higher accuracy without necessity of using parts such as the beam splitter, which is conventionally used to obtain a wavelength-dependent signal and a wavelength-independent signal. Therefore, according to the present invention, it is possible to reduce the number of parts of the wavelength stabilized laser module and obtain a good space efficiency, so that the size of the wavelength stabilized laser module can be made small enough to be received even in the casing of the conventional semiconductor laser module. Further, since the assembling work and the regulating work during the fabrication thereof are easy, the fabrication cost thereof can be substantially reduced.

Now, a second embodiment of the wavelength stabilizing unit of the present invention and modifications thereof will be described with reference to FIG. 4A to FIG. 6B. In each of the second embodiment and the modifications thereof, a LD (not shown) is incorporated in a separate module and laser light emitted from the LD is guided to the wavelength stabilizing unit through an optical fiber 14 as in the case of the first embodiment.

Figure 4A:
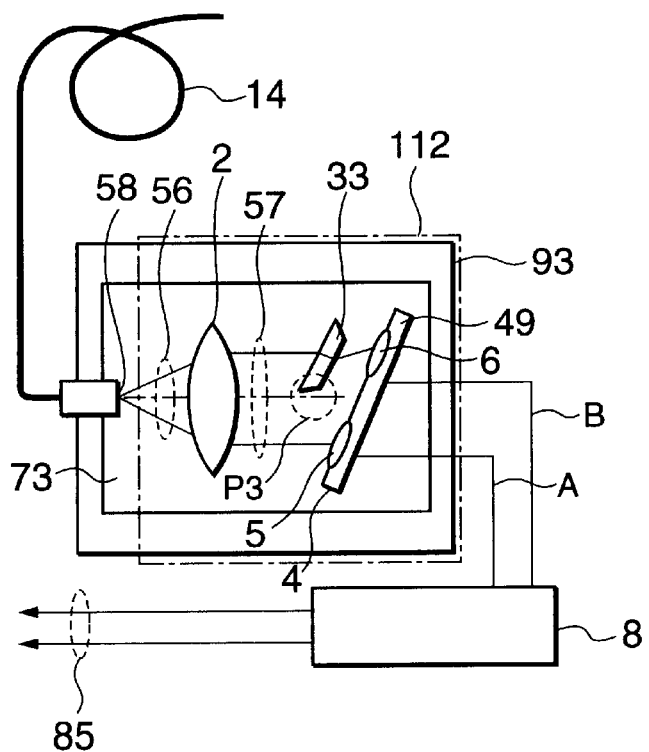
FIG. 4A shows a main construction of a wavelength stabilizing unit according to a second embodiment of the present invention.

Referring to FIG. 4A, the wavelength stabilizing unit 112 of the second embodiment includes an optical lens 2 as light bundle paralleling means for converting a divergent light 56 emitted from the emitting point 58 to a parallel light bundle, a wavelength filter 33 having transmittance, which is continuously changed depending on wavelength, and an optical detector 4, all of which are mounted on a substrate 73 and encased in a casing 93. The optical lens 2 functions to convert the diverging laser light 56 emitted from the emitting point 58 set in an end portion of the optical fiber 14 led into the casing 93 into a parallel light bundle 57. The first photoelectric conversion element 5 directly receives a portion of the parallel light bundle 57 and converts it into an electric signal A and the second photoelectric conversion element 6 receives another portion of the parallel light bundle 57 after passed through the wavelength filter 33 and converts it into an electric signal B. The electric signals A and B are supplied to an operation circuit 8. An incident angle of light to the wavelength filter 33 is regulated by an angle regulating mechanism, which is not shown, and side faces of the wavelength filter 33 are machined such that the side faces do not cross a straight line, which passes an edge portion of an incident surface 331 of the wavelength filter 33 and extends in parallel to an optical axis 55 of the parallel light bundle 57, as shown in FIG. 4E. In detail, assuming that an angle between the optical axis 55 and the incident surface 331 is α degrees and an angle between the side face 333 and the incident surface 331 is β degrees as show in FIG. 4B, the side face 333 is machined by such as polishing such that an equation $(180-\alpha) \geq \beta$ is established. Other side faces than the side face 333, on which the parallel light bundle 57 is incident, are machined similarly. The wavelength filter 33 and the optical detector 4 are arranged in a slanted relation to a plane orthogonal to the optical axis 55 such that light reflected thereby is not directed back to the light emitting point 58.

The wavelength stabilizing unit 112 of this embodiment differs from the wavelength stabilizing unit 110 of the first embodiment in only that the optical lens 2 is provided between the light emitting point 58 and the wavelength filter 31 of the first embodiment as the light bundle paralleling means and the side face 333 of the wavelength filter 33 is machined such that the side face do not cross the straight line, which passes the ridge portion of the incident surface 331 of the wavelength filter 33 and extends in parallel to an optical axis 55 of the parallel light bundle 57. The operation of the wavelength stabilizing unit 112 of the second embodiment is similar to that of the first embodiment.

That is, in the wavelength stabilizing unit 112 of the second embodiment, the laser light emitted from the LD (not shown) guided into the casing 93 through the optical fiber 14 and divergently emitted in the casing 93 from the light emitting point 58 as the emitted light 56 is paralleled to the parallel light bundle 57 by the lens 2. A portion of the light bundle 57 is directly incident on the first photoelectric conversion element 5 and converted thereby into the electric signal A. Another portion of the light bundle 57 is incident on the wavelength filter 33. The wavelength filter 33 outputs light having strength depending on wavelength of the incident light and the output light is incident on the second photoelectric conversion element 6 and converted thereby into the electric signal B. Therefore, the electric signal A carries an optical output information of the LD at that time point and the electric signal B carries an information containing the optical output information of the LD at that time point and the wavelength information of the light from the LD at that time point. By appropriately regulating the angle of the incident surface 331 of the wavelength filter 33 with respect to the optical axis, the electric signal B can carry an information of wavelength variation within a range having a center wavelength equal to the reference wavelength $\lambda_0$, which is an aimed value at which the wavelength is to be stabilized.

Figure 4B:
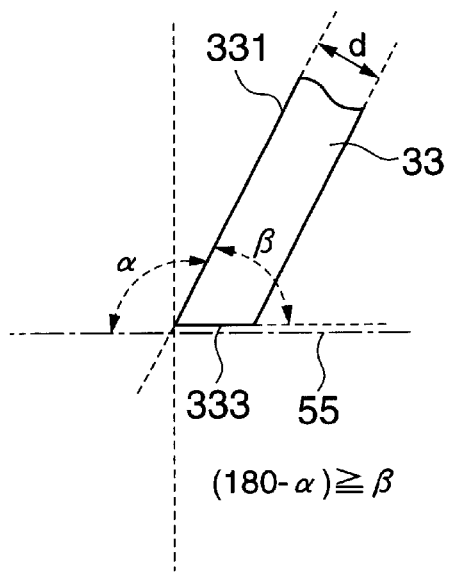
FIG. 4B shows a portion P3 in FIG. 4A in an enlarged scale.

In the wavelength stabilizing unit 112 shown in FIG. 4B, the electric signals A and B are supplied to the operation circuit 8. The operation circuit 8 detects a variation of the light output of the LD and a variation of the oscillation wavelength from a sum of the electric signals A and B and a difference between the electric signal A and the electric signal B and continuously feedbacks a control signal 85 to at least one of an injection current regulating device and a temperature regulating device of the LD, which are not shown, such that the light output and the oscillation wavelength of the LD become predetermined values to stabilize the light output of the LD and the oscillation wavelength.

The wavelength stabilizing unit 112 according to this embodiment of the present invention can be constructed by only adding the light paralleling means such as the lens 2 for paralleling the emitted light 56 to the parallel light bundle to the first embodiment. Therefore, the size of the wavelength stabilizing unit can be made small enough to be housed in a casing of the conventional semiconductor laser module, while keeping the optical output constant and further stabilizing the oscillation wavelength by excluding stray light. Further, since the assembling thereof and the regulating operation during the fabrication of the wavelength stabilizing unit are simple and easy, there is a merit that the fabrication cost can be substantially reduced. Further, by paralleling the divergent light 56 to the parallel light bundle 57, signal to noise ratio (S/N ratio) of the electric signal A as well as B can be increased, so that the oscillation wavelength can be stabilized with higher accuracy compared with the first embodiment.

Figure 5A:
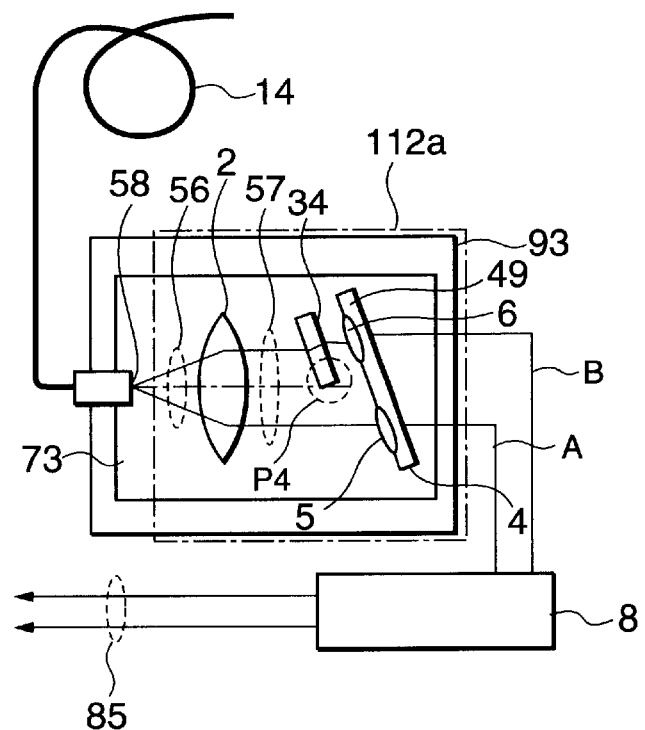
FIG. 5A shows a modification of the main construction of the wavelength stabilizing unit according to the second embodiment of the present invention.
Figure 5B:
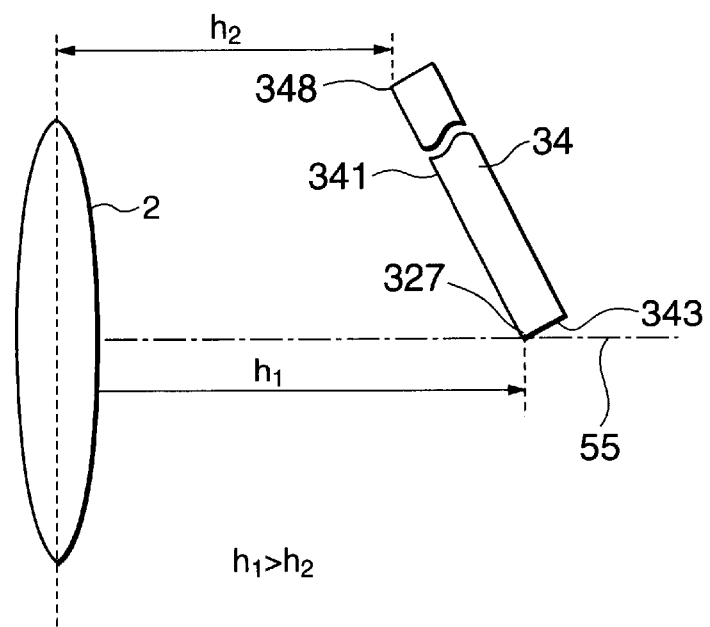
FIG. 5B shows a portion P4 in FIG. 5A in an enlarged scale.
Figure 6A:
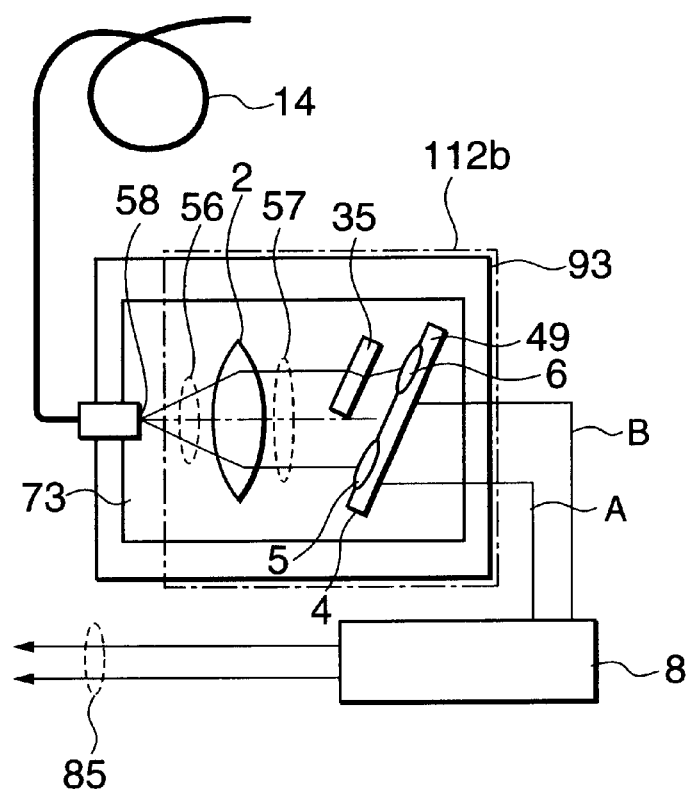
FIG. 6A shows another modification of the main construction of the wavelength stabilizing unit according to the second embodiment of the present invention.
Figure 6B:
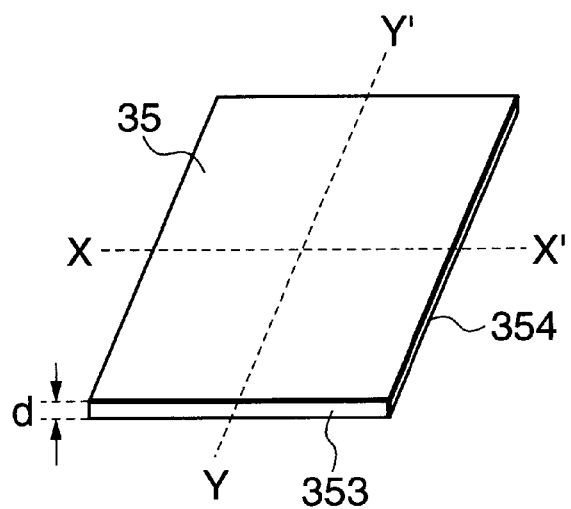
FIG. 6B is a perspective view of an example of a wavelength filter used in the wavelength stabilizing unit according to the second embodiment of the present invention.

A first modification of the second embodiment will be described briefly with reference to FIG. 5A and FIG. 5B. In FIG. 5A and FIG. 5B, showing a wavelength stabilizing unit 112a, which is the first modification of the second embodiment of the present invention, a wavelength filter 34 is arranged such that a distance $h_1$ between a first ridge portion 347 close to an optical axis of an emitted light 55 and a lens 2 as the light bundle paralleling means is larger than a distance $h_2$ between a second ridge portion 348 remote from the optical axis 55 and the lens 2. Therefore, even when side faces including a side face 343 of the wavelength filter 34 are machined at right angle with respect to an incident surface 341 of the wavelength filter 34 as usual, at least the side face 343 does not cross a straight line passing an edge portion of the incident surface 341 of the wavelength filter 34 in parallel to the optical axis 55, resulting in a similar effect to that obtainable in the wavelength stabilizing unit 112.

A second modification of the second embodiment of the present invention will be described with reference to FIG. 6A to FIG. 8. Since a construction of a wavelength stabilizing unit 112b of the second modification is the same as that of the wavelength stabilizing unit 112 except the structure of the wavelength filter thereof, only a structure of the wavelength filter 35 of the second modification will be described.

Figure 7A:
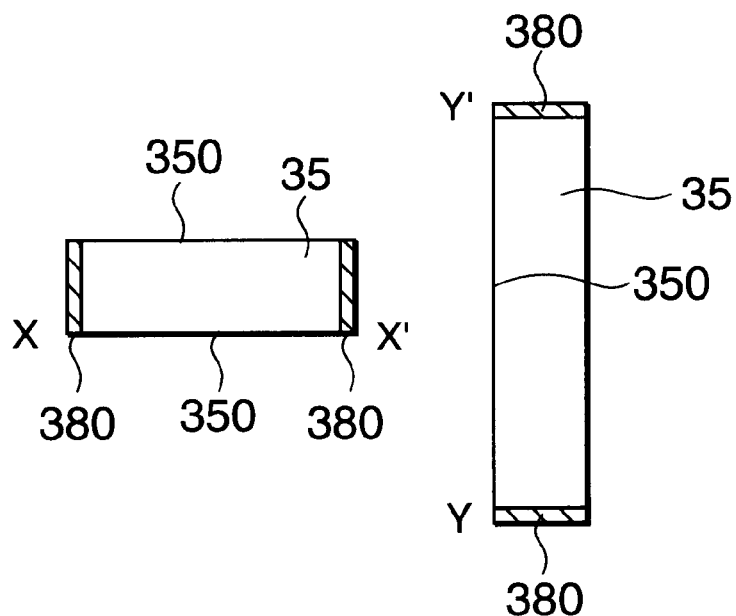
FIG. 7A shows cross sections taken along lines X–X' and Y–Y' in FIG. 6B, with side faces of the wavelength filter being coated by a coating film of a predetermined material.
Figure 7B:
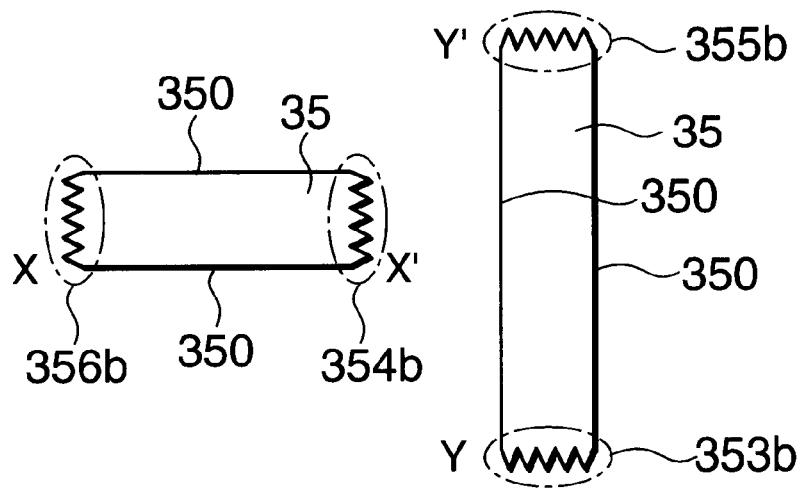
FIG. 7B shows cross sections taken along lines X–X' and Y–Y' in FIG. 6B, with the side faces of the wavelength filter being roughed.

The wavelength filter 35 used in the wavelength stabilizing unit 112b has side faces coated with coating films 380 formed of a predetermined material and attached thereto, as shown in FIG. 7A, or roughened as shown by side faces 353b, 354b, 355b and 356b in FIG. 7B.

Figure 8:
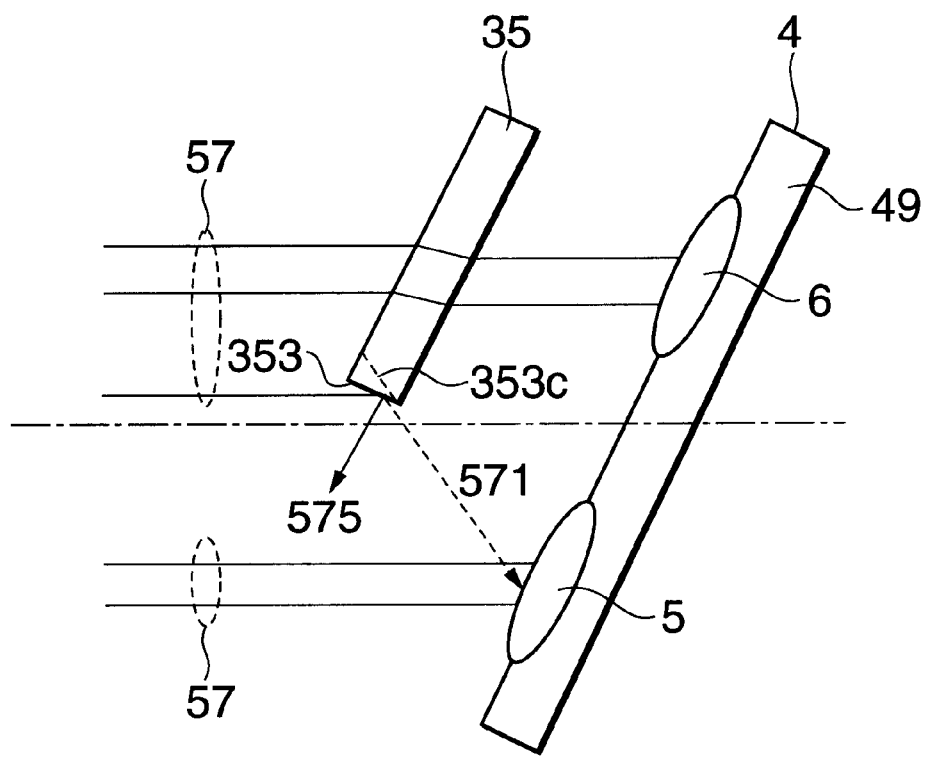
FIG. 8 shows another modification of the main construction of the wavelength stabilizing unit according to the second embodiment of the present invention.

In the case where the side faces have the coating films 380 attached thereto as shown in FIG. 7A, the coating film 380 may be any of a titanium oxide ($TiO_2$) film, a silicon oxide ($SiO_2$) film, non-reflection film including a multi layered film of these films, a reflection film such as a vapor-deposited metal film containing aluminum and a light absorbing film obtained by blacking the side face by such as anodic oxidation of aluminum. The surface roughening shown in FIG. 7B may be performed by such as sand blustering. In a case where the reflection film is attached to the side face of the wavelength filter and the first photoelectric conversion element 5 is possibly irradiated with reflection light such as reflection light 571 shown in FIG. 8, a side face 353 in FIG. 8 is machined to form a side face 353c for preventing reflection light therefrom from irradiating the first photoelectric conversion element 5. Although, in the second modification, all of the side faces of the wavelength filter 35 are coated with the coating film 380 or roughened, the coating or roughening operation may be performed for at least regions of the side faces on which light incident. Further, it is possible to arbitrarily combine the first and second modifications of the second embodiment with other embodiments and modifications thereof.

According to the wavelength stabilizing unit 112b in which the side faces of the wavelength filter 35 are processed as mentioned, it is possible to remove light reflected by the side faces or substantially reduce randomly reflected light returning to the first photoelectric conversion element 5. Therefore, it becomes possible to substantially reduce stray light without machining the side faces by such as polishing.

Now, a wavelength stabilized laser module 102, which is encased in a casing 94 together with the wavelength stabilizing unit 112 and a LD 1, will be described with reference to FIG. 9A. Incidentally, in this embodiment, the wavelength stabilizing unit 112 can be replaced by the wavelength stabilizing unit 112a or 112b with the same effect. FIG. 9B shows the wavelength stabilized laser module 102 using the wavelength stabilizing unit 112b shown in FIG. 6A. In any way, the wavelength stabilized laser module 102 having wavelength stabilizing unit 112 will be described.

Figure 9A:
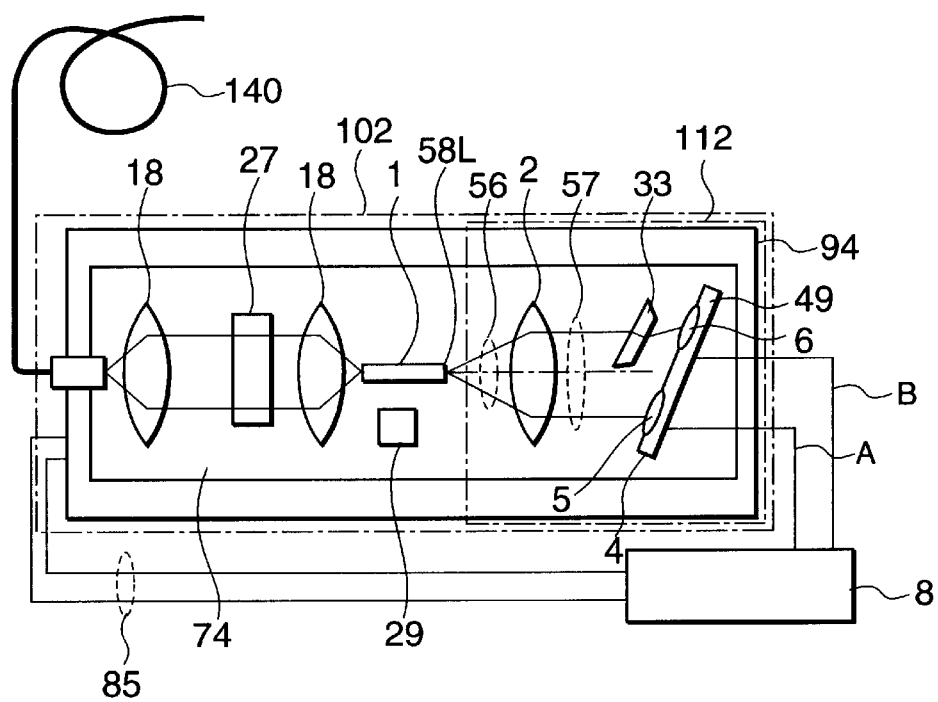
FIG. 9A shows an example of a wavelength stabilized laser module constructed by incorporating the wavelength stabilizing unit according to the second embodiment of the present invention and a LD in a single casing, in which the wavelength stabilizing unit is shown in FIG. 4A.
Figure 9B:
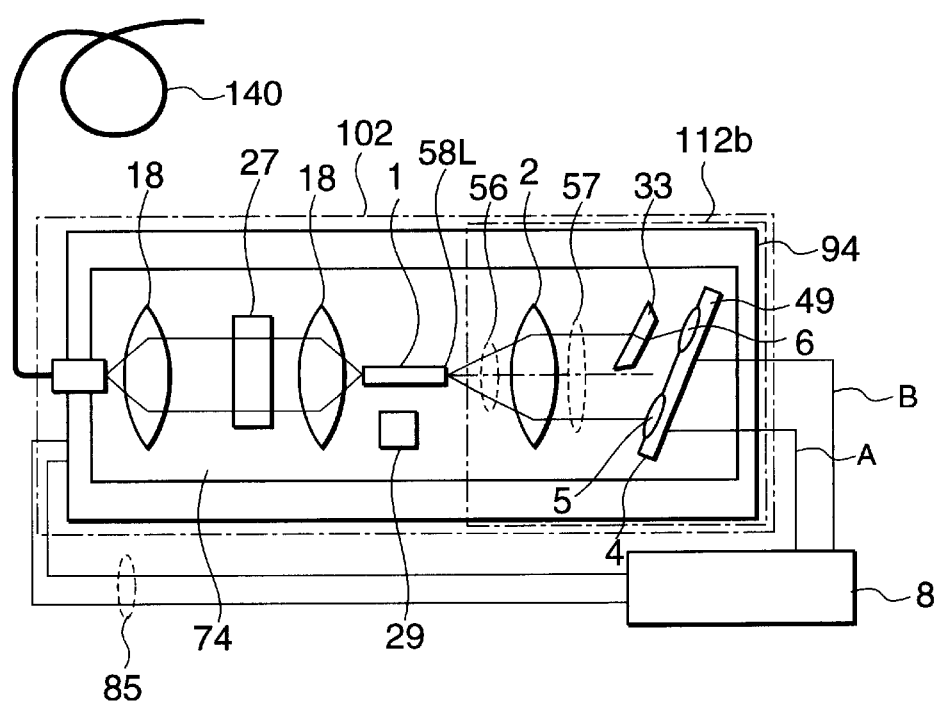
FIG. 9B shows an example of a wavelength stabilized laser module constructed by incorporating the wavelength stabilizing unit according to the second embodiment of the present invention and a LD in a single casing, in which the wavelength stabilizing unit is shown in FIG. 6A.
Figure 10A:
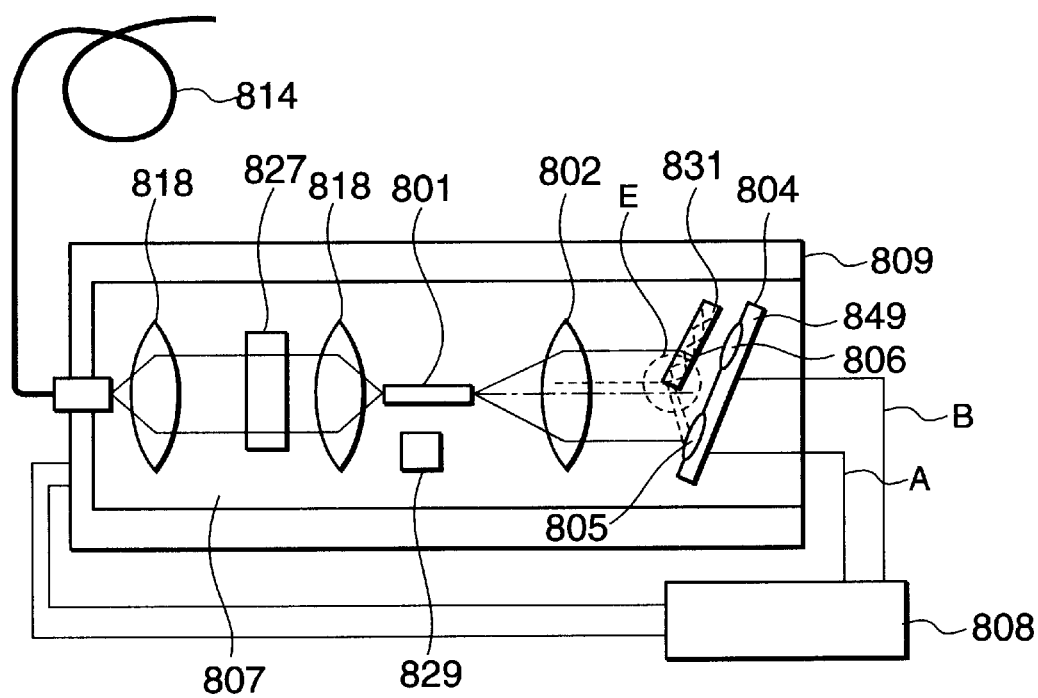
FIG. 10A shows a construction of the wavelength stabilized laser module disclosed in the prior application.
Figure 10B:
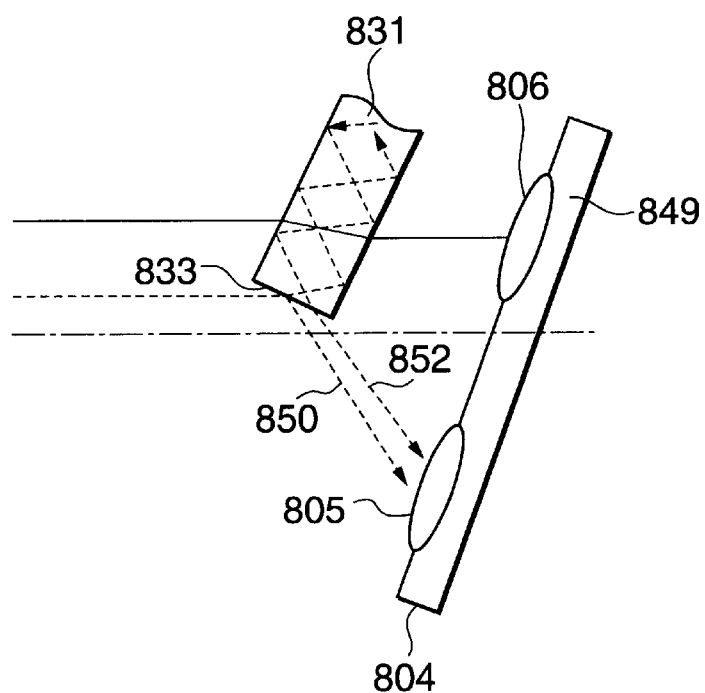
FIG. 10B shows a portion E in FIG. 10A in an enlarged scale.

Referring to FIG. 9A, the wavelength stabilized laser module 102 includes, in the casing 94, the LD 1 and the wavelength stabilizing unit 112. The first photoelectric conversion element 5 of the wavelength stabilizing unit 112 directly receives a portion of the parallel light bundle 57, which is obtained by paralleling the divergent laser light 56 emitted from an emitting point 58L set in the output end of the LD 1 by means of the lens 2, and converts it into the electric signal A. The second photoelectric conversion element 6 of the wavelength stabilizing unit 112 receives another portion of the light bundle 57 passed through the wavelength filter 33 and converts it into the electric signal B. The LD 1 is mounted on the substrate 74 having, for example, a Peltier element so that operating temperature thereof can be regulated. The wavelength filter 33 and the optical detector 4 are arranged in a slanted relation to a plane orthogonal to the optical axis 55 of the parallel light bundle 57 such that reflected light is not directed back to the light emitting point 58L, that is, the LD 1.

On the substrate 47, an optical fiber coupling lens 18, an optical isolator 27 and a thermistor 29 for temperature detection, etc., are also mounted and incorporated, together with the LD 1 and the wavelength stabilizing unit 112, in the casing 94 having size similar to that of the conventional semiconductor laser module. A signal light for optical communication is supplied through the optical fiber 140 connected to the wavelength stabilized laser module. Temperature of the substrate 74 can be controlled by the Peltier element thereof. Therefore, oscillation wavelength is stabilized by controlling temperature of the LD 1 and temperature of all of the optical parts in the casing 94 is controlled constant. Since the oscillation wavelength stabilizing operation of the wavelength stabilized laser module 102 is the same as that of the above mentioned wavelength stabilizing unit 112, details thereof are omitted, except that the control signal 85 is fedback to the Peltier element, which is the temperature regulating device of the LD 1, and the injected current regulating device, which are not shown.

The wavelength stabilized laser module 102 having the LD 1 and the wavelength stabilizing unit 112 attains higher stabilization of oscillation wavelength while keeping the light output constant without requiring such part as beam splitter, which is conventionally used to obtain wavelength-dependent signal and wavelength-independent signal. Therefore, it is possible to reduce the number of parts of the wavelength stabilized laser module and obtain a good space efficiency, so that the size of the wavelength stabilized laser module can be made small enough to be received even in the casing of the conventional semiconductor LD module. Further, since the assembling work and the regulating work during the fabrication thereof are easy, the fabrication cost thereof can be substantially reduced.

In the described embodiments, each of the wavelength filters 31 to 36 may be an etalon-type filter for transmitting light having very narrow wavelength range by optical interference or a multi-layered filter formed by forming a multi-layered dielectric film on a glass substrate. In the case of the multi-layered filter, thickness of the glass substrate can be set arbitrarily. Therefore, the wavelength filter can be made compact by reducing the thickness of the glass substrate.

Figure 14:
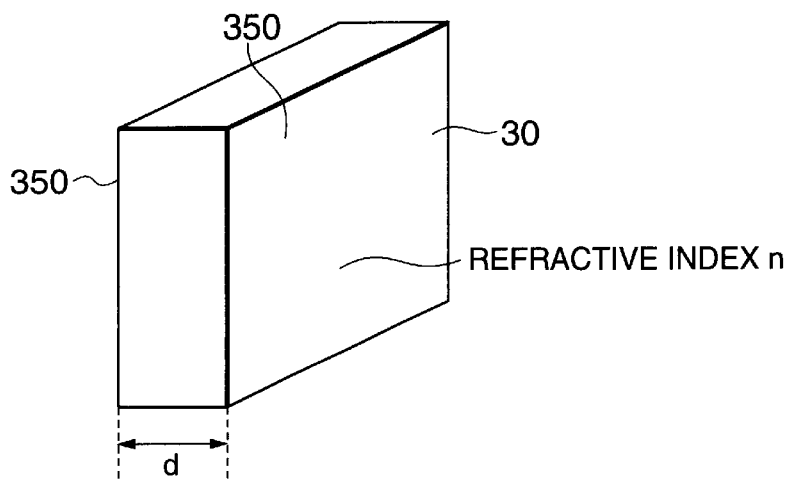
FIG. 14 is a perspective view of an etalon-type filter, showing a basic structure thereof.
Figure 15:
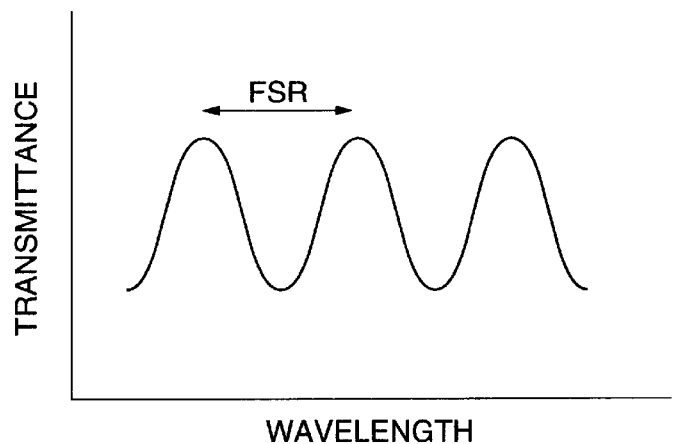
FIG. 15 is a transmission spectrum of an etalon-type filter, showing a relation between wavelength and transmittance.

Now, the etalon type filter and its function will be described in detail. The etalon type filter, which is sometimes referred to as Fabry-Perot interferometer, has light transmission characteristics for transmitting light having wavelength in a very narrow range determined by light interference. As shown in FIG. 14, a basic structure of the etalon type filter is a parallel optical glass having thickness d and incident and emitting parallel surfaces 350, which are surface-polished with high precision (in the order of 1/100 wavelength). Light is reflected a plurality of times within the glass having refractive index n. By the interference between transmitting and reflected lights within the glass plate, the glass plate becomes a wavelength filter having transmission characteristics, which includes alternating high transmittance portions and low transmittance portions with respect to wavelength as shown in FIG. 15. Since waveform of the optical current flowing the photoelectric conversion element when the latter receives light transmitted through the wavelength filter is completely the same as that of the light, the optical current corresponding to the transmittance will be used instead of the transmittance in the following description. Interval of peaks of the transmittance shown in FIG. 15 is referred to as FSR (free spectral range). Representing magnitude of FSR in frequency unit, the following equation is established:

$$FSR = c/2nd \quad (2)$$

where d is thickness of the etalon type filter, n is refractive index and c is light velocity and light is incident on the etalon type filter vertically. Therefore, by selecting the refractive index n of the glass and the thickness d of the glass plate suitably, it is possible to arbitrarily set FSR of the etalon-type filter.

Figure 16:
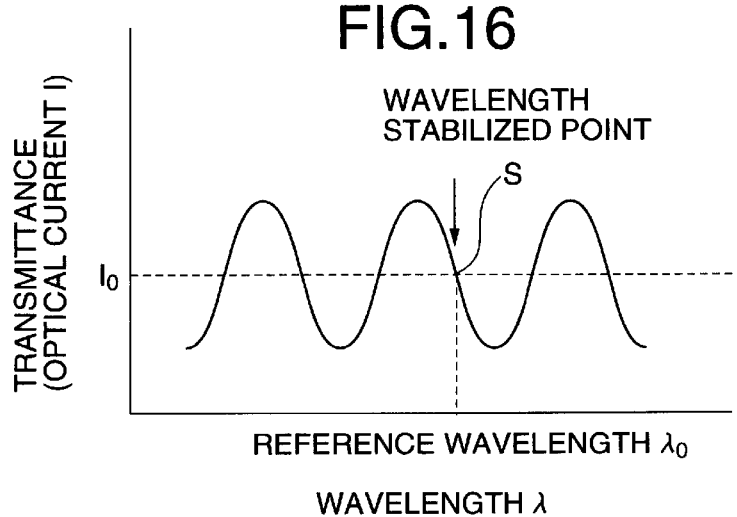
FIG. 16 is a transmission spectrum of an etalon-type filter, showing the wavelength stabilizing function of the etalon-type filter.

In performing the wavelength stabilizing control, the reference wavelength $\lambda_0$, which is an aimed wavelength at which wavelength is to be stabilized, is set in a wavelength range in which transmittance of the etalon-type filter monotonically decreases or monotonically increases, as shown in FIG. 16. A positional point of the reference wavelength $\lambda_0$ on the transmittance spectrum will be referred to as wavelength stabilizing point S.

As shown by an arrow in FIG. 16, it is assumed that the wavelength stabilizing point S is set in an intermediate of a wavelength range on a right side of a peak transmittivity from which transmittivity is monotonically decreases. Assuming that transmittance of the etalon-type filter at the wavelength stabilizing point S at which the wavelength becomes the reference wavelength $\lambda_0$ is $I_0$, transmittance becomes smaller than $I_0$ when the wavelength of laser light emitted from the LD is longer than the reference wavelength $\lambda_0$ and transmittance becomes larger than $I_0$ when the wavelength of laser light emitted from the LD is shorter than the reference wavelength $\lambda_0$. It is possible to detect the wavelength of the laser light emitted by the LD from the variation of transmittance (I) if the reference wavelength $\lambda_0$ is in a certain wavelength range in the vicinity of the wavelength stabilizing point S. Therefore, it is possible to stabilize the wavelength of the emitted light from the LD by performing a control such that the transmittance (I) becomes always $I_0$.

For example, when a reference value of optical current detected by the first photoelectric conversion element 5 is set such that light output of the LD 1 of the wavelength stabilized laser module using the present wavelength stabilizing unit becomes 20 mW and the injected current of the LD 1 is controlled such that the light output of the LD 1 always becomes the reference value, the wavelength stabilized laser module becomes a light output constant mode. In this state, by controlling temperature of the LD 1 such that the optical current of the second photoelectric conversion element 6 becomes the reference current value, that is, the reference transmittance, $I_0$ with respect to the wavelength stabilizing point S shown by the arrow in FIG. 16, the wavelength stabilization can be realized. The control method in this case may be performed by forming a feedback loop by means of an analog electronic circuit or may be performed by using a software feedback loop constructed by converting it into a digital data by means of an AD converter and constructing a control circuit on a computer.

Figure 13A:
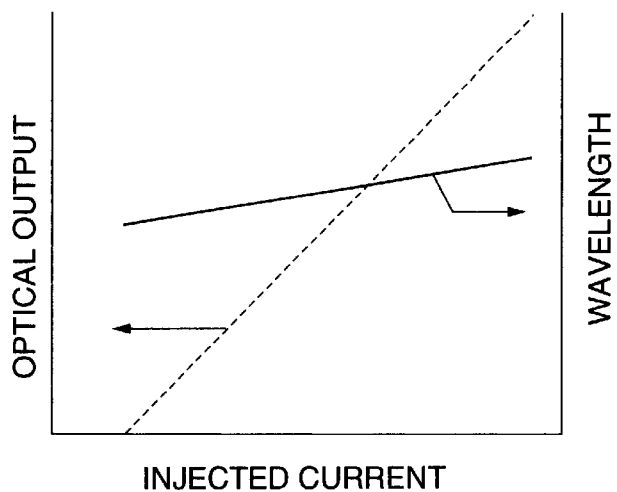
FIG. 13A is a graph for explaining reasons for variation of optical output and wavelength of a semiconductor laser, showing the injected current dependency thereof.
Figure 13B:
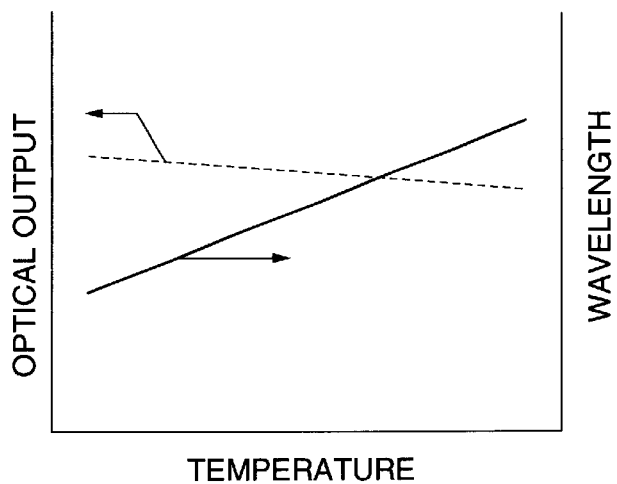
FIG. 13B is a graph for explaining reasons for variation of optical output and wavelength of a semiconductor laser, showing the temperature dependency thereof.

Further, as shown in FIG. 13A and FIG. 13B, oscillation wavelength of a LD is varied by changing not only the temperature of the LD element but also the injected current of the LD and, on the other hand, the optical output is varied by changing not only the injected current but also the temperature of the LD. Therefore, in order to control the optical output to a constant value by controlling the optical current of the first photoelectric conversion element 5, it is possible to use a feedback loop for controlling the injected current and the temperature of the LD element simultaneously. Similarly, in order to control the oscillation wavelength to a constant value by controlling the optical current of the second photoelectric conversion element 6, it is possible to use a feedback loop for controlling the injected current and the temperature of the element simultaneously.

Figure 17:
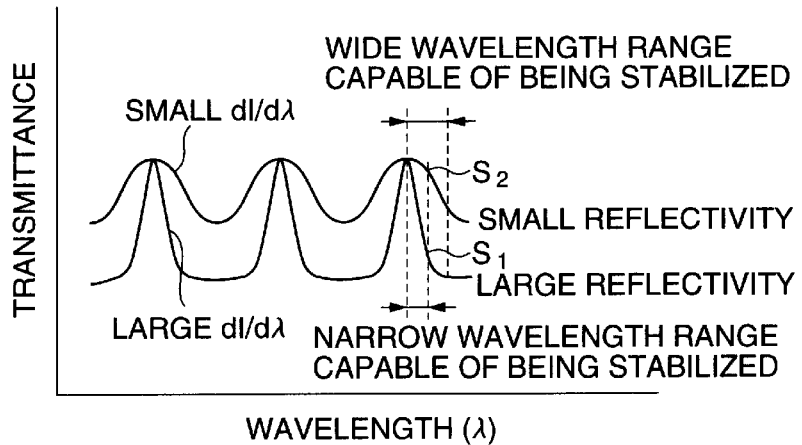
FIG. 17 is a transmission spectrum of an etalon-type filter, showing the transmission characteristics of the etalon type filter.

As described, the wavelength controllability of the wavelength stabilized laser module depends largely on the transmission characteristics of the etalon type filter. Particularly, as shown in FIG. 17, the gradient of a shoulder portion of the transmittance period containing the wavelength stabilizing point S, that is, the magnitude of gradient $dI/d\lambda$, is very important because it influences gain of the feedback loop for wavelength stabilization. The transmission characteristics of the etalon-type filter is used depends largely on the reflectivity of the input and output surfaces of the etalon-type filter as shown in FIG. 17. That is, when the reflectivity of the incident and emitting surfaces of the etalon-type filter is large, the transmission characteristics thereof has a sharp peak close to δ—function and the gradient $dI/d\lambda$ at the wavelength stabilizing point $S_1$ becomes large. In this case, however, the wavelength range in which the wavelength stabilization is possible becomes narrow. On the other hand, when the reflectivity of the incident and emitting surfaces of the etalon-type filter is small, the transmission characteristics thereof becomes gentle like a sin curve and the wavelength range in which the wavelength stabilization is possible becomes wide. In this case, the gradient $dI/d\lambda$ at the wavelength stabilizing point $S_2$ becomes small. Therefore, the large reflectivity of the etalon-type filter is particularly suitable in a case where highly accurate wavelength stability is required and the small reflectivity is suitable when a large wavelength range in which the stabilization is possible is required, rather than the wavelength stability.

Incidentally, in order to regulate the wavelength range in which the wavelength stabilization is possible, it is effective to regulate FSR of the etalon type filter. In order to widen the wavelength range in which the wavelength stabilization is possible, it is enough to make FSR large and make the reflectivity of the incident surface of the etalon-type filter. If the gradient $dI/d\lambda$ is large enough to perform the wavelength stabilization, an etalon type filter having arbitrary FSR can be used in the present wavelength stabilized laser module.

In the present wavelength stabilized laser module, it is possible to freely change the transmission characteristics of the etalon type filter by regulating the incident angle. As shown in FIG. 18A, for example, the gradient at the wavelength stabilizing point Sa becomes very large when FSR of the etalon type filter and the reflectivity of the incident and emitting surface thereof are preliminarily set to a very narrow value such as 100 GHz (0.8 nm) and a relatively high value such as about 60%, respectively, and the incident angle of the parallel light bundle on the light receiving surface of the etalon type filter 30 is set to 0°. When the incident angle of the etalon type filter is gradually increased from 0°, the FSR of the etalon type filter is shifted as shown in FIG. 18B and FIG. 18C and, when the incident angle is further increased, the peak is shifted by a width of FSR (1 period) as shown in FIG. 18D. In this state, transmittance of the transmission characteristics becomes small due to such fact as that the reflectivity of the incident and emitting surfaces of the etalon-type filter is lowered with increase of the incident angle. Therefore, the gradient at the wavelength stabilizing point Se becomes small as shown in FIG. 18E. As mentioned, in the wavelength stabilized laser module according to the present invention, it is possible to perform not only the setting of the reference wavelength to be stabilized but also the regulation of the gradient at the wavelength stabilizing point S, which is an important parameter in the feedback loop for wavelength stabilization, by merely regulating the angle of the etalon type filter 30.

Since the optical axis with respect to the optical detector 4 is not deviated even if the angle of the etalon type filter 30 is changed, it is enough, in order to set the reference wavelength $\lambda_0$ to be stabilized, to regulate the incident angle of the etalon-type filter 30 without regulating the position of the optical detector 4. Further, in the construction of the wavelength stabilized laser module according to the present invention, the output signals of the photoelectric conversion elements 5 and 6 are supplied independently to the operation circuit 8. Therefore, there is no need of regulating levels of these signals within the casing of the wavelength stabilized laser module. That is, the tolerance for positional deviation of the optical detector, etc., becomes large.

In a case where the wavelength stabilized laser module of the present invention is applied to DWDM, it is necessary to obtain specifically high accuracy of wavelength. In order to obtain specifically high accuracy, it is effective to make the gradient at the wavelength stabilizing point S larger as mentioned previously. That is, it is necessary to make the magnitude (ON/OFF ratio) of the transmission characteristics of the filter used in the present invention. When, for example, the parallelism of the parallel light bundle converted by the lens 2 is low, that is, when deviation angle of beam with respect to the parallel line is large, and beam diverges (or converges) as shown in FIG. 19, the light received by the second photoelectric conversion element 6 contains lights incident on the filter at different angle. On the other hand, since the transmission characteristics of the etalon type filter is incident angle dependent, there is a range of wavelength of light transmitted through the filter if there is a range of incident angle of light. Referring this wavelength range as to "light receiving wavelength width", it is necessary, in order to improve the accuracy of wavelength stabilization, to make the light receiving wavelength width narrow. It has been found from experiments conducted by the present inventors that, when the light receiving wavelength width exceeds, for example, 100 pm, it becomes difficult to apply the present invention to the wavelength stabilized device for DWDM. Therefore, the parallelism of light with which the light receiving wavelength width becomes, for example, 100 pm or less is required.

Figure 20:
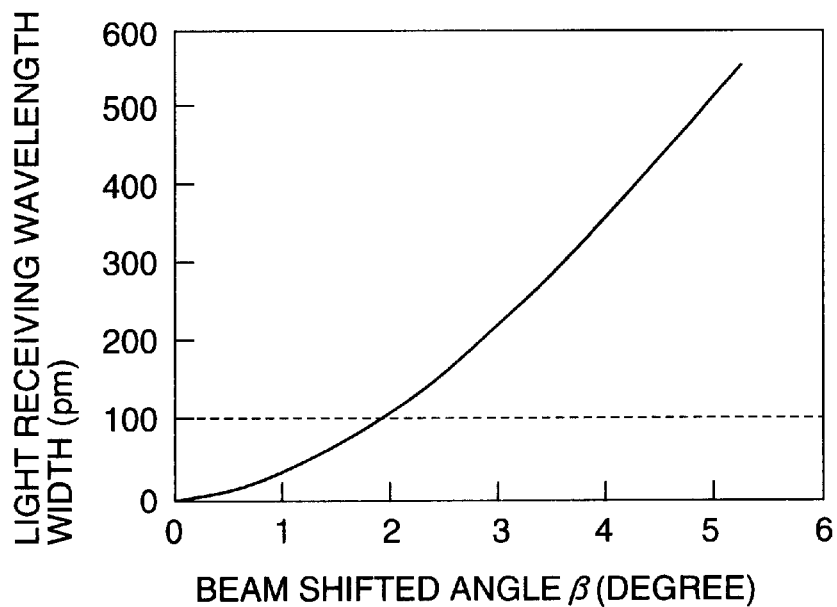
FIG. 20 is a graph showing a relation between deviation angle of light beam and receiving light wavelength width pm.

FIG. 20 shows an example of a relation between the beam shifted angle and the light receiving wavelength width in a case where diameter of light received by the second photoelectric conversion element 6 is 0.05 mm, the center position of the light receiving surface is deviated by 0.2 mm from the center of the lens, a distance between the position of the major surface of the lens 2 and the light receiving surface is 1 mm and the filter is arranged vertically with respect to the optical axis X. As is clear from FIG. 20, when the light receiving wavelength width is set 100 pm or less in order to apply the present invention to the wavelength stabilized device for DWDM, the parallelism (beam shifted angle β) of the parallel light bundle converted by the lens 2 is preferably within ±2°. Fortunately, to mount the related components with the parallelism being within ±2° is much easier than to mount a lens for condensing light to, for example the optical fiber with required accuracy and it can be realized easily without using expensive optical members such as aspherical lens.

For example, as shown in FIG. 9A, the wavelength stabilized laser module using the wavelength stabilizing unit according the second embodiment of the present invention includes the optical fiber coupling lenses 18, the optical isolator 27 and the temperature detecting thermistor 29, etc., and the wavelength stabilizing unit including the LD 1, the lens 2, the wavelength filter 33 and the optical detector having the photoelectric conversion elements 5 and 6, which are mounted on the substrate 74 and is encased in the casing 94 having size similar to that of the conventional LD module, and light signal for optical communication is emitted to the casing through the optical fiber 140 connected thereto, wherein the wavelength filter 33 may be an etalon type filter. When any of the modifications of the second embodiment of the present invention is used as the wavelength stabilizing unit, it is, of course, possible to construct the wavelength filter of the wavelength stabilizing unit thereof with an etalon type filter.

Temperature of the substrate 74 is controllable by the Peltier element. Therefore, the Peltier element can control temperature of the LD 1 to stabilize the oscillation wavelength thereof and control temperature of all of the optical parts within the casing to a constant temperature.

As mentioned, the wavelength stabilized laser module using the wavelength stabilizing unit of the present invention has a very compact construction, which can be encased in a casing of the conventional laser module.

The LD 1 of the wavelength stabilized laser module using the wavelength stabilizing unit of the present invention may be a LD having an element structure integrated with an exciton absorption type semiconductor optical modulator or a wavelength variable type LD, etc.

When the LD 1 is one integrated with the exciton absorption type semiconductor optical modulator, it is possible to make the construction of the whole optical transmission system compact compared with the case where a DFB laser and the external modulator are constructed as separate modules.

Figure 21:
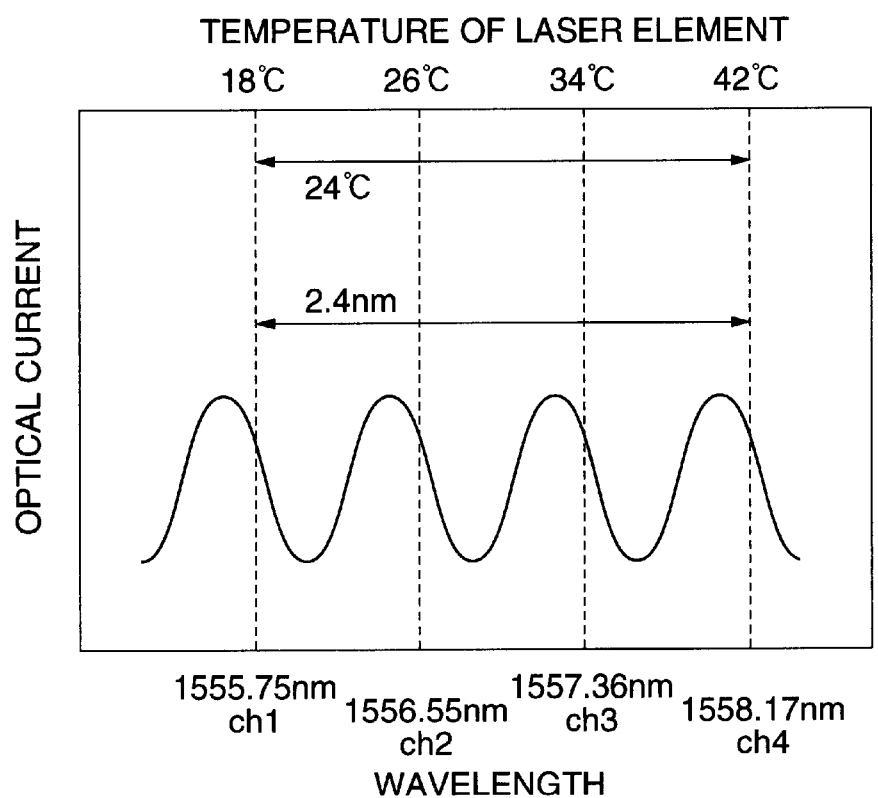
FIG. 21 is a transmission spectrum of an etalon type filter, showing the temperature dependency of transmission characteristics of the etalon type filter.

When the LD 1 is the wavelength variable type LD, it is possible to cover a plurality of channels having different wavelengths and, therefore, it is possible to reduce the backup cost in the DWDM system. The wavelength variable type LD is featured by that it is possible to change the oscillation wavelength. In the DWDM system, which has become popular recently, a light source unit including a plurality of LD's for channels having different wavelengths is required. Further, since the same number of light source units are necessary for the backup purpose, the backup cost tends to be substantially increased with increase of the number of channels. If it is possible to back up a plurality of channels by means of a single wavelength variable laser, the backup cost is reduced correspondingly. Under the circumstances, demand of a wavelength variable type LD capable of covering 2 to 4 or more channels has been increased. The wavelength variable type LD, which has the most general structure and whose practical use is expected, is of the type in which oscillation wavelength is changed by changing temperature of the conventional DFB laser. In the general DFB laser having wavelength in 1.55 micron range, oscillation wavelength is changed by about 1 nm when the temperature thereof is changed by 10°. That is, as shown in FIG. 21, the DFB laser can cover 2.4 nm corresponding to 4 channels with interval of 100 GHz (0.8 nm) by changing its temperature by ±12° C.

An example in which the wavelength variable type LD covering 4 channels is used as the LD 1 of the wavelength stabilized laser module 102 shown in FIG. 9A incorporated with the wavelength stabilizing unit 112 of the second embodiment and an etalon type filter having FSR of 90 GHz is used as the wavelength filter 33 will be described in detail.

In order to perform the wavelength stabilization control at a plurality of wavelengths separated with equal interval, it is enough to use the etalon type filter having FSR separated with the same interval and to detect the transmittance periods, which are different every reference wavelength to be stabilized. It should be noted that general quartz glass used as a material of the etalon type filter has temperature dependent transmittance period, practically. For example, if only one reference wavelength is to be stabilized, the temperature range to be controlled is within about ±1° C. However, if temperature of the wavelength variable type LD is changed by as large as 24° C., influence of the temperature characteristics of the etalon type filter is not negligible. As shown in an upper portion of FIG. 22, a center wavelength of the general etalon type filter is shifted by 0.1 nm every temperature change of 1020 C.

Figure 22:
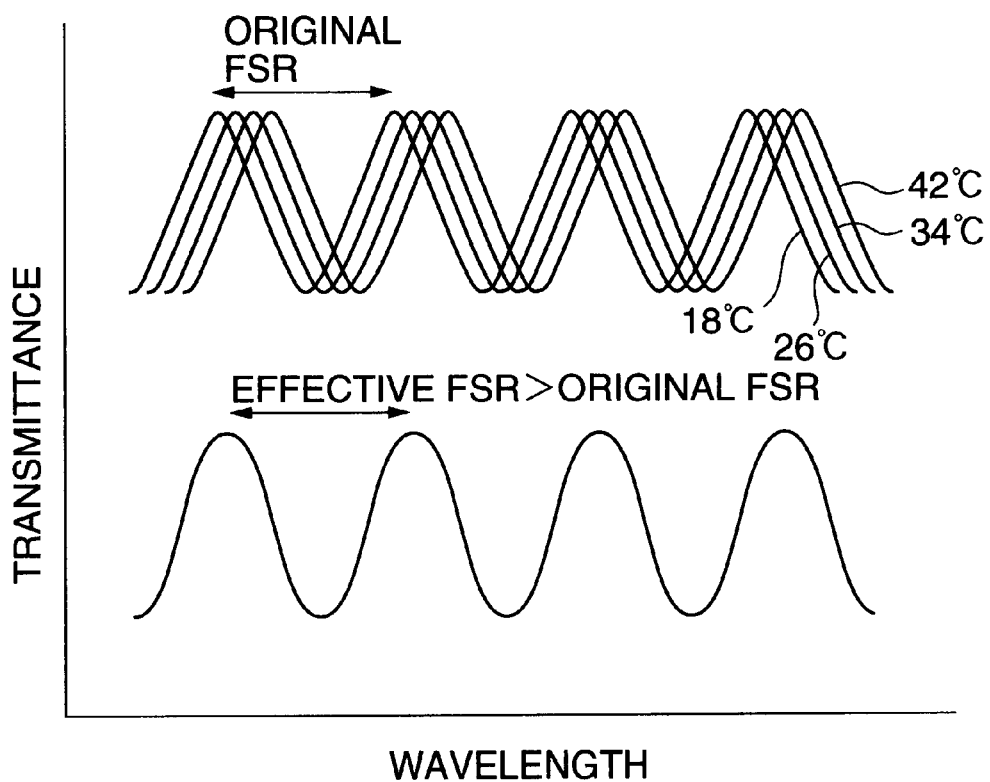
FIG. 22 is a transmission spectrum of an etalon type filter, showing the temperature dependency of transmission characteristics of the etalon type filter.

In the wavelength stabilized laser module 102 in this example in which the wavelength filter 33 and the LD 1 are mounted on the same substrate 74 and temperature-controlled by the Peltier element, the transmittance of the wavelength filter 33 of the etalon type has wavelength dependency such as shown in the lower portion in FIG. 22 when temperature of the substrate 74 is changed with change of the oscillation wavelength of the LD 1. That is, practical FSR becomes wider than original FSR. The practical FSR will be referred to as "effective FSR", hereinafter. When the wavelength stabilized laser module is designed such that the effective FSR is adjusted to 100 GHz (0.8 nm), which is the wavelength interval of the DWDM system, it becomes possible to perform the wavelength stabilization for each channel.

The original FSR and the effective FSR of the etalon type filter used as the wavelength filter 33 are represented as follow by using the temperature characteristics and oscillation wavelength of the etalon-type filter:

$$D = (1 - T_{etalon}/T_{LD}) \times D_0$$

where D represents the wavelength interval of transmittance period of the etalon type filter, $D_0$ represents an interval between a plurality of oscillation wavelengths of the semiconductor laser, $T_{etalon}$ represents an amount of change of a center frequency when temperature of the etalon type filter is changed by 1° C. and $T_{LD}$ represents an amount of change of oscillation frequency of the semiconductor laser when temperature thereof is changed by 1° C. Incidentally, the center wavelength represents a certain one of wavelengths at which the transmittance becomes maximum.

Now, a method for stabilizing a plurality of reference wavelengths in the wavelength variable type LD will be described.

In FIG. 21, the wavelength variable type LD operates at wavelengths from channel ch1 to channel ch4 (in this case, wavelengths are set to 1555.75 nm~1558.17 nm). On the other hand, the operating temperatures of ch1 to ch4 are 18° C., 26° C., 34° C. and 42° C., as shown in FIG. 21. Since, in this case, $T_{LD}$ is about 0.1 nm/° C. and $T_{etalon}$ is about 0.01 nm/° C., it is enough, in order to make the effective FSR 100 GHz, to set the original FSR to 90 GHz. By regulating the angle of the etalon type filter under this condition, the wavelength dependency of transmittance at respective temperatures becomes as shown by the upper portion in FIG. 22 and the effective FSR becomes substantially equal to 100 GHZ as shown by the lower portion in FIG. 22. By arranging the etalon type filter set in this manner in front of the second photoelectric conversion element 6 for wavelength monitoring, it is possible to stabilize the wavelengths in the respective channels similarly to the case where a single reference wavelength is stabilized.

In the case where the etalon-type filter is used as the wavelength filter in the previously mentioned example, the wavelength stabilization is performed by using a slope of the right side shoulder portion of the transmittance period of the etalon-type filter. However, the same effect can be obtained by using the left side of the transmittance period. Further, it is possible to perform the wavelength stabilization for a half of the FSR interval, that is, the interval of 50 GHz. In the latter case, since the control direction is reversed in the feedback loop every channel, it must be corrected within the wavelength stabilized laser module.

In the above mentioned example, the FSR of the etalon type filter is 90 GHz. However, this value must be set after the temperature characteristics of the etalon type filter is obtained, since this value is different depending on the temperature characteristics of the etalon type filter. Further, the matching accuracy of the effective FSR with the interval of a plurality of reference wavelengths is usually about ±3%. However, the accuracy is dependent largely on the wavelength range in which the wavelength can be stabilized and the number of wavelength channels to be stabilized and a higher accuracy is required if the wavelength range capable of being stabilized is narrow or the number of wavelength channels to be stabilized is large.

In the respective embodiments of the present invention, which are described previously, the first and second photoelectric conversion elements are exemplified as the optical detector 4 having the integrated array structure including two light receiving surfaces. However, these photoelectric conversion elements may be arranged in parallel as individual units. In any case, the characteristics of the first and second photoelectric conversion elements and the light receiving areas thereof may be the same, respectively, or different from each other. Further, an outer configuration of the incident surface of the wavelength filter is not limited to the square shown in FIG. 6B. Any other outer configuration of the incident surface of the wavelength filter can be used, provided that the side faces thereof are machined such that the conditions described in the respective embodiments are satisfied and that a portion of the emitted light or the parallel light bundle obtained by paralleling the emitted light is directly incident on the first photoelectric conversion element and another portion thereof is passed through the wavelength filter and incident on the second photoelectric conversion element. Further, the configuration of the optical detector is also any, provided that the optical detector is constructed such that a portion of the emitted light or the parallel light bundle obtained by paralleling the emitted light is directly incident on the first photoelectric conversion element and another portion thereof is directly incident on the wavelength filter and only light portion passed through the wavelength filter is incident on the second photoelectric conversion element.

Further, although expensive quartz material is usually used for the etalon-type filter, the quartz material may be replaced by silicon-based material, which is inexpensive and can be machined easily. Silicon material is substantially transparent in a wavelength range from 1.3 microns to 1.6 microns, which is usually used in an optical communication and, therefore, it has characteristics as a low loss filter material. Further, silicon has a high possibility that the micromachine technology, which is becoming practical recently, can be applied thereto and that the angle regulation and the positional regulation of the silicon substrate can be controlled with high accuracy by using the micromachine technology. Further, since the refractivity of silicon is about twice that of quartz glass, it is possible to reduce the thickness of the filter. Particularly, when FSR is to be set to a small value such as about 50 GHz, the etalon type filter mounted on a quartz glass substrate becomes 2 mm thick or more, so that light diffracted at an edge of the filter may be incident on the first photoelectric conversion element 5, possibly causing erroneous operation. When silicon is used as the material of the filter substrate, the thickness of the filter is about 1 mm even when FSR is 50 GHz, so that the above problem can be restricted.

As described hereinbefore, the wavelength stabilizing unit and the wavelength stabilized laser module using the wavelength stabilizing unit, according to the present invention, can stabilize the optical output and the oscillation wavelength with high accuracy. Further it can be constructed with a small number of parts, providing a good space efficiency, so that the size of the wavelength stabilized laser module can be made small enough to be received even in the casing of the conventional semiconductor laser module. Further, since the assembling work and the regulating work during the fabrication thereof are easy, the fabrication cost thereof can be substantially reduced.

What is claimed is:

1. A wavelength stabilizing unit comprising:
    a first photoelectric conversion member for directly receiving a portion of a laser light emitted from a predetermined emitting point of a semiconductor laser converting the portion of the laser light into a first electric signal;
    a wavelength filter for directly receiving a portion of the laser light, said wavelength filter having transmittance continuously changed depending on wavelength of the portion of the laser light incident thereon directly;
    a second photoelectric conversion member for receiving filtered light passed through said wavelength filter and converting the filtered light into a second electric signal; and
    a stray light blocking member for preventing the laser light incident on a side face portion of said wavelength filter from being incident on said first photoelectric conversion member through said wavelength filter.

2. A wavelength stabilizing unit as claimed in claim 1, further comprising light bundle paralleling member for converting the emitted light into a parallel light bundle, wherein said first photoelectric conversion member receives a portion of the parallel light bundle directly and said wavelength filter receive a portion of the parallel light bundle directly.

3. A wavelength stabilizing unit as claimed in claim 2, wherein said light bundle paralleling member is a lens, a portion of the parallel light bundle emitted from said lens is directly incident on said first photoelectric conversion member and another portion of the parallel light bundle is incident directly on said wavelength filter.

4. A wavelength stabilizing unit as claimed in claim 2, wherein parallelism of the parallel light bundle is within ±2°.

5. A wavelength stabilizing unit as claimed in claim 1, wherein said stray light blocking member is a stray light blocking wavelength filter having side faces machined such that a straight line connecting the emitting point and an edge portion of an incident surface of said wavelength filter on which the emitted light is incident and an extension of the straight line do not cross said side face of said wavelength filter.

6. A wavelength stabilizing unit as claimed in claim 2, wherein said stray light blocking member is a stray light blocking wavelength filter having side faces machined such that side faces of said wavelength filter is not irradiated with the parallel light bundle.

7. A wavelength stabilizing unit as claimed in claim 6, wherein said stray light blocking wavelength filter is said wavelength filter, which has at least said side face irradiated with the parallel light bundle and machined such that said side face does not cross a straight light parallel to the optical axis of the parallel light bundle passing an edge portion of said incident surface on which the parallel light bundle is incident.

8. A wavelength stabilizing unit as claimed in claim 2, wherein said stray light blocking member is provided by arranging said wavelength filter such that a distance between a first edge portion of said incident surface of said wavelength filter on which the parallel light bundle is incident and which is the closest to the optical axis and said light bundle paralleling member is larger than a distance between a second edge of said incident surface remotest item the optical axis and said light bundle paralleling member and said wavelength filter does not cross the optical axis of the parallel light bundle.

9. A wavelength stabilizing unit as claimed in claim 2, wherein said stray light blocking member is a stray light blocking wavelength filter, an angle of the side face of said stray light blocking wavelength filter with respect to the incident surface on which the parallel light bundle is incident being set smaller than an angle of said incident surface with respect to a portion of the optical axis of the parallel light bundle, which is on the side of said first photoelectric conversion member from said stray light blocking wavelength filter.

10. A wavelength stabilizing unit as claimed in claim 1, wherein said stray light blocking member is a stray light blocking wavelength filter formed by coating side faces of said wavelength filter with a predetermined material selected from a group consisting of materials including at least non-reflection film materials and light absorbing film materials.

11. A wavelength stabilizing unit as claimed in claim 1, wherein said stray light blocking member is a stray light blocking wavelength filter formed by coating side faces of said wavelength filter with a reflection film material and arranging said first photoelectric conversion element such that said first photoelectric conversion element is not irradiated with light reflected by said side faces.

12. A wavelength stabilizing unit as claimed in claim 1, wherein said stray light blocking member is a stray light blocking wavelength filter formed by roughing side faces of said wavelength filter to make said side faces irregular.

13. A wavelength stabilizing unit as claimed in claim 1, wherein said wavelength filter has a transmission characteristics in which the transmittance monotonically increases or decreases depending on wavelength in a wavelength band containing the reference wavelength at which the oscillation wavelength of said semiconductor laser is to be stabilized.

14. A wavelength stabilizing unit as claimed in claim 1, wherein said wavelength filter is able to change a gradient of wavelength dependent transmittance variation by selecting an incident angle thereof.

15. A wavelength stabilizing unit as claimed in claim 1, wherein said wavelength filter has a single peak transmission characteristics in which transmittance becomes maximum or minimum in a wavelength range in which there is no reference wavelength included.

16. A wavelength stabilizing unit as claimed in claim 1, wherein said wavelength filter is an etalon-type filter having a periodic transmittance in which transmittance is repeatedly changed between extreme value and minimal value with constant wavelength interval.

17. A wavelength stabilizing unit as claimed in claim 16, wherein said semiconductor laser is of wavelength variable type capable of oscillating at a plurality of wavelengths depending on temperature and the wavelength interval of the transmittance period of said etalon-type filter is set according to the following equation:

$$D=(1-T_{etalon}/T_{LD}) \times D_0$$

where D is the wavelength interval of transmittance period of said etalon-type filter, $D_0$ is an interval between a plurality of oscillation wavelengths of the semiconductor laser, $T_{etalon}$ is an amount of change of a center frequency when temperature of the etalon-type filter is changed by 1° C. and $T_{LD}$ is an amount of change of oscillation frequency of the semiconductor laser when temperature thereof is changed by 1° C. Incidentally, the center wavelength represents a certain one of wavelengths at which the transmittance becomes maximum.

18. A wavelength stabilizing unit as claimed in claim 1, wherein said wavelength filter is formed of a transparent material having refractive index larger than that of quartz glass.

19. A wavelength stabilized laser module comprising:
a semiconductor laser;
a temperature regulating member for regulating temperature of said semiconductor laser; and
a wavelength stabilizing unit claimed in claim 1.

20. A wavelength stabilized laser module as claimed in claim 19, wherein said semiconductor laser has a construction in which said semiconductor laser is integrated with an exciton absorption type semiconductor optical modulator.

* * * * *

UNITED STATES PATENT AND TRADEMARK OFFICE
CERTIFICATE OF CORRECTION

PATENT NO. : 6,711,188 B2
DATED : March 23, 2004
INVENTOR(S) : Ito et al.

It is certified that error appears in the above-identified patent and that said Letters Patent is hereby corrected as shown below:

Column 23,
Line 6, "item" should be -- from --.

Signed and Sealed this

Twenty-second Day of March, 2005

JON W. DUDAS
*Director of the United States Patent and Trademark Office*